US011871520B2

(12) United States Patent
Knox et al.

(10) Patent No.: US 11,871,520 B2
(45) Date of Patent: Jan. 9, 2024

(54) METHOD FOR PRODUCING A PRINTED WIRING BOARD

(71) Applicant: BOTFACTORY INC., Long Island City, NY (US)

(72) Inventors: Michael Knox, Manhasset, NY (US); Andrew Ippoliti, Sunnyside, NY (US); Georgios Kyriakou, New York, NY (US); Carlos Ospina, New York, NY (US); Nicolas Vansnick, Brooklyn, NY (US)

(73) Assignee: BOTFACTORY INC., Long Island City, NY (US)

( * ) Notice: Subject to any disclaimer, the term of this patent is extended or adjusted under 35 U.S.C. 154(b) by 475 days.

(21) Appl. No.: 16/995,507

(22) Filed: Aug. 17, 2020

(65) Prior Publication Data
US 2020/0383250 A1    Dec. 3, 2020

Related U.S. Application Data

(62) Division of application No. 14/392,408, filed as application No. PCT/US2014/067986 on Dec. 1, 2014, now Pat. No. 10,779,451.

(60) Provisional application No. 61/910,210, filed on Nov. 29, 2013, provisional application No. 62/053,796, filed on Sep. 23, 2014.

(51) Int. Cl.
| | |
|---|---|
| *H01R 31/00* | (2006.01) |
| *H05K 13/04* | (2006.01) |
| *H05K 3/12* | (2006.01) |
| *H05K 3/46* | (2006.01) |
| *H05K 3/34* | (2006.01) |

(52) U.S. Cl.
CPC ....... *H05K 13/0408* (2013.01); *H05K 3/1241* (2013.01); *H05K 3/3485* (2020.08); *H05K 3/4685* (2013.01); *H05K 13/0469* (2013.01); *H05K 2203/013* (2013.01); *H05K 2203/0126* (2013.01)

(58) Field of Classification Search
CPC ........... H05K 13/0408; H05K 13/0469; H05K 3/1241; H05K 3/3485; H05K 3/4685; H05K 2203/0126; H05K 2203/013; B33Y 10/00; B33Y 80/00; B33Y 30/00
See application file for complete search history.

(56) References Cited

U.S. PATENT DOCUMENTS

| | | | |
|---|---|---|---|
| 10,548,231 B2* | 1/2020 | Knox | H05K 3/4685 |
| 11,596,071 B2* | 2/2023 | Knox | G01R 31/2805 |
| 2011/0066994 A1* | 3/2011 | Kunimoto | G06F 30/30 |
| | | | 716/122 |

\* cited by examiner

*Primary Examiner* — Paul D Kim
(74) *Attorney, Agent, or Firm* — Herbert F. Ruschmann; Law Office of Herbert F. Ruschmann

(57) ABSTRACT

A method for producing a printed circuit board on a substrate uses control data derived from a circuit schematic, CAD file, Gerber file or files or equivalents, to operates a function head configured to effect printing conductive and non-conductive materials on the substrate and produces control data to effect the circuit printing. The method optionally uses a layout translation module configured to accept PCB multilayer circuit board files and convert multilayer circuit board layout data of the PCB multilayer circuit board files to printing data files for controlling the function head to print conductive material and nonconductive material onto the substrate to produce a printed circuit effecting functionality of the multilayer circuit board layout data.

39 Claims, 10 Drawing Sheets

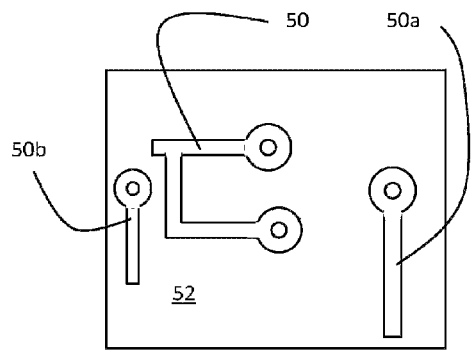
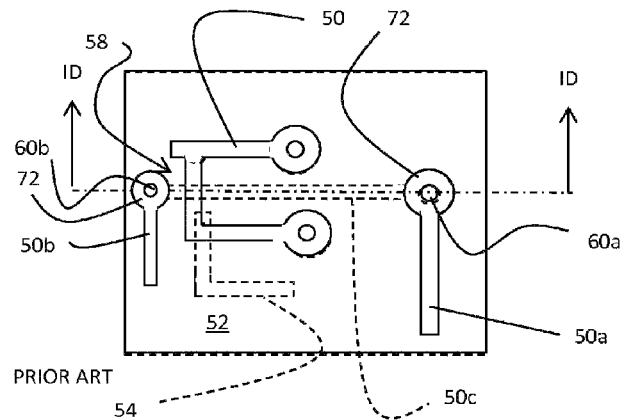
Fig. 1A
Fig. 1C
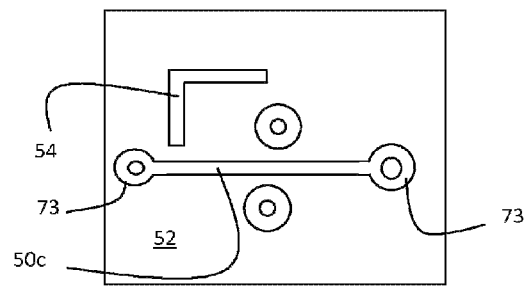
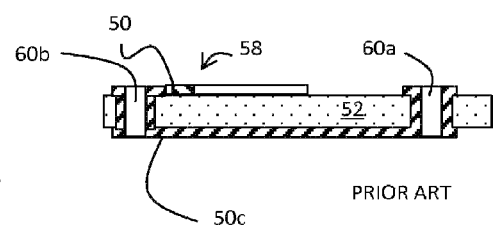
Fig. 1B
Fig. 2
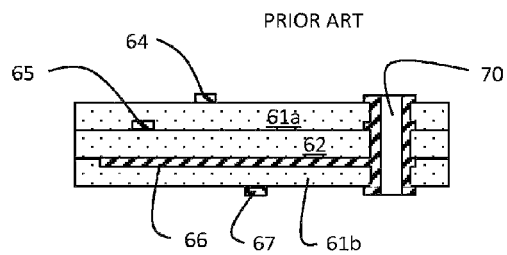
Fig. 3

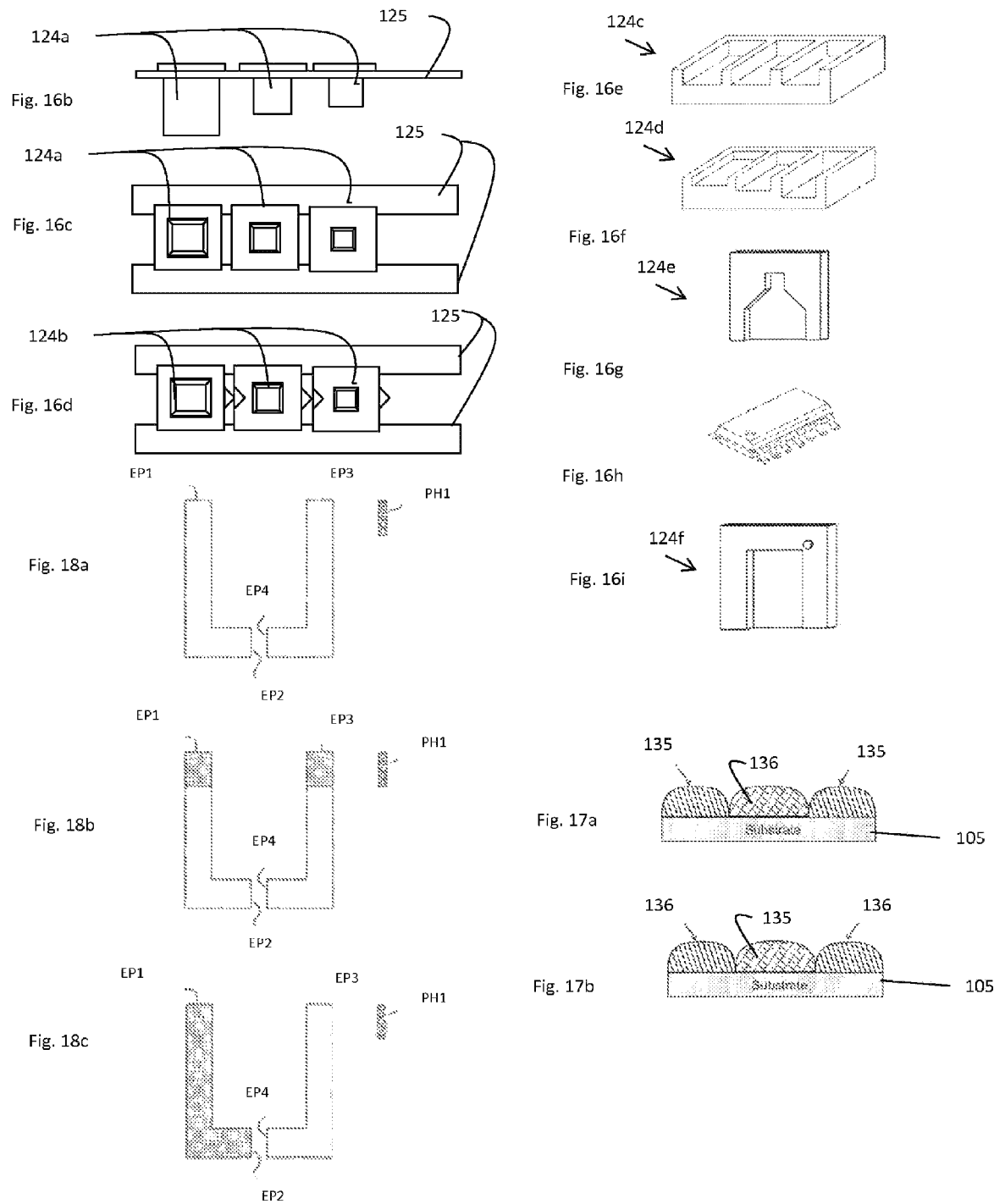

Direction of Current Flow

METHOD FOR PRODUCING A PRINTED WIRING BOARD

RELATED APPLICATIONS

This application is a divisional application of national stage application Ser. No. 14/392,408, 5 having a filing date of filed Dec. 1, 2014, now U.S. Pat. No. 10,779,451, which is the national stage of PCT application serial number PCT/US2014/067986, filed Dec. 1, 2014, and this application claims priority to U.S. provisional patent application No. 62/053,796, filed Sep. 23, 2014, U.S. provisional patent application No. 61/910,210, filed Nov. 29, 2013, and said national stage application Ser. No. 14/392,408, all of which are hereby incorporated herein by reference. Material of the provisional filings is intended only to augment the present disclosure and wording in the provisional applications is not to be interpreted as limiting this disclosure or requiring any material in the provisional applications as critical, indispensable, or a requirement unless so stated herein.

TECHNICAL FIELD

The present disclosure relates to fabrication and assembly of printed circuit boards including deposition of conductive traces and placement of components.

BACKGROUND

Modern electrical devices are comprised of semiconductor circuits integrated into small packages, passive components, Printed Wiring Board (PWB) and solder. The complete assembly is often referred as a Printed Circuit Board (PCB) or Printed Circuit Assembly (PCA). The manufacture of a traditional PCA is a multistep process that may include several specialized and often expensive machines. These highly specialized machines are directed to one operation during the PCA manufacture. For example, a typical PWB, is manufactured using a thin sheet of copper foil that is laminated to a non-conductive substrate. The copper thickness may be 1.4 mils (1 ounce) and the substrate is typically FR-4 with a substrate thickness of 62 mils. Other thicknesses and substrates are also available. Referring to FIG. 1A, conductive circuit elements or traces, such as lines, runs, pads and other wiring features, are created by removing copper from the laminated substrate by chemically etching or mechanically machining as illustrated in FIG. 1A. This subtractive process leaves behind conductive traces 50, 50a, and 50b, located on a top surface of substrate 52. Referring to FIG. 1B, it may be necessary to include a second set of conductive traces, 50c and 54, which are electrically isolated from other conductive traces. In this case, conductive traces 50, 50a, and 50b, are etched to the top surface of the substrate 52 and conductive traces 50c and 54, are etched on a bottom surface of the substrate 52. Referring to FIG. 1C, by placing conductive traces, 50c and 54, on an opposite side of the substrate 52, the conductive traces, 50 and 54, can cross each other, for example at crossover 58, without making electrical connection.

Referring to FIGS. 1C and 2, when electrical connection is optionally used between the conductive traces, 50c and 50a, a via 60a is placed through substrate 52. The via 60a, often referred to as a "plated-through hole," is typically manufactured in a two-step process wherein a hole is first drilled through the conductive traces, 50c and 50a, and the substrate 52 and then the hole is plated with copper thus making connection between the two conductive traces.

When complex circuits are manufactured especially for a small dimensional footprint, the complete board may contain multiple printed wiring boards stacked to allow copper lines to cross over each other while maintaining electrical isolation. Referring to FIG. 3, a four-layer PWB comprises substrate 61a and substrate 61b glued together with prepreg 62. PWB substrate 61a, has conductive traces 64 etched on a top side and conductive traces 65 etched to a bottom side. PWB substrate 61b has conductive traces 66 etched on a top side and conductive traces 67 etched to a bottom side. A via 70 is capable of connecting traces to any combination of conductive traces on different layers. The prepeg 62 is an insulating material used to electrically isolate conductive traces 65 and 66.

Highly specialized equipment is used to manufacture printed wiring boards in order to rapidly fabricate the boards at an economical cost. The etching equipment only performs one of several tasks optionally used to assemble a complete PCA. Once the printed wiring board is etched and drilled, the exposed copper traces are typically coated with solder, silver, nickel/gold, or some other anti-corrosion coating. The finished printed wiring board is then typically sent to another facility for assembly of electronic components onto the PWB. The attachment of electronic components, e.g., semiconductor and passive components, are made using a solder reflow process. In one typical process, solder paste is applied to the PWB using screen printing techniques. Once the solder is printed onto the board, the electrical components are positioned onto the board. Positioning the components is often referred as "pick-and-place". Components may be manually placed, often with tweezers, or in high volume production, components may be placed with a computer controlled machine. Once the components are all positioned on the solder paste, the PCA is placed in an oven to melt (reflow) the solder paste which will permanently attach the components to the board. Because of the multiple machines and technologies involved, this complete process can often take up to 4 weeks to complete.

The process of determining routing of the conductive traces is often performed using a Computer Aided Design (CAD) software tool. When using CAD, a user enters a schematic of a desired circuit including electrical components and package sizes. The CAD tool generates a set of files used as a mask when chemically etching each layer of the PWB. The same file is optionally used to control a Computer Numerically Controlled (CNC) milling machine when mechanically etching the PWB. When mechanically etching the PWB, the CNC milling machine removes copper along an outside edge of a desired conductive trace leaving behind a copper line that is electrically isolated from other conductive traces. The CAD tool output is in a file format that is typically Gerber. Gerber is an industry standard in the PWB industry which allows multiple vendors to share the same data without loss of information. The file format is optionally native to the CAD tool such as Eagle, OrCAD and Altium to name a few. In all cases, there is information for each layer of the PWB. During the layout process, the CAD tool will attempt to route the conductive traces based on a set of design rules which include the number of layers used in the PWB. For example, an entry in the CAD tool may be the use of a four-layer board which implies that there will be four independent layers of conductive traces. The CAD tool will route conductive traces to cross over each other while not making electrical contact. When the CAD tool knows that insulating layers exist between the multiple conductive layers and knowing that the insulating layers extend to the edges of the PWB, cross-overs are easily created by dropping the line from one layer of conductive traces to a second layer of conductive traces and moving across the layer and finally returning to the original side of the PWB. As an example, referring to FIGS. 1A-1C, and 2, conductive traces 50, 50a and 50b, are etched on the top side of the substrate 52 and it is desired to have conductive trace 50a make an electrical connection to conductive trace 50b. The conductive trace 50c is routed between the other conductive traces, 50a and 50b, and connection is made through a pair of vias, 60a and 60b, as the electrical connection is dropped to a lower conductive layer and runs underneath the conductive trace 50 through the conductive line 50c. When using vias, 60a and 60b, conductive pads 72 are typically optionally used around the hole location to compensate for tolerances when drilling the via hole. In FIGS. 1B and 1C, conductive pads 72 are etched on the top of the substrate 52. Conductive pads, 73 and 72, are etched on the bottom of the substrate 52 or any other lower level of a multilayer PWB. In practice, conductive pads, 70 and 72, typically have the same diameter however, this is not required. Connecting conductive trace 50a to conductive trace 50b is made through conductive pads, 72 and 73, and plated-through vias 60a and 60b. When the conductive trace routing is complete, the CAD tool will produce a drill file which includes the location of via hole 60a and via hole 60b. The drill file is used to control a CNC machine for drilling holes in the PWB. The drill file is included as an output from the CAD tool.

The conventional multilayer PCB production method is expensive and requires multiple machines to produce a multilayer PCB. Thus, a need exist for a single apparatus and method which can produce a completed circuit board and optionally populate the circuit board with components.

SUMMARY OF THE DISCLOSURE

Accordingly, it is an object of the disclosure to provide a PCB production apparatus and method which provides for producing PCB's using ink and/or epoxy printing and optionally component placement.

Briefly stated, the present disclosure provides an apparatus for producing a printed circuit board on a substrate, has a table for supporting the substrate, a function head configured to effect printing conductive and non-conductive materials on the substrate, a positioner configured to effect movement of the function head relative to the table, and a controller configured to operate the function head and the positioner to effect the printing of conductive and non-conductive materials on the substrate. The apparatus optionally has a layout translation module configured to accept PCB multilayer circuit board files and convert multilayer circuit board layout data of the PCB multilayer circuit board files to printing data files for controlling the function head to print conductive material and nonconductive material onto the substrate to produce a printed circuit effecting functionality of the multilayer circuit board layout data.

In accordance with these and other objects of the disclosure, there is further provided an embodiment of the above described apparatus further having a component feed device disposed to present components for placement on the substrate with the substrate disposed on the table. The function head includes a component placement device configured to pick up the components and release the components. The controller is further configured to operate the component placement device, the function head and the positioner to effect placement the components on the substrate.

In a further embodiment of the present disclosure, an apparatus as described above is provided wherein the layout translation module is configured to accept the PCB multilayer circuit board files and convert component placement data of the PCB multilayer circuit board files to placement data files configured for controlling the function head and the component placement device to accept the components from the component feed device and place the components onto the substrate in accordance with the placement data files.

In yet a further embodiment of the present disclosure, an apparatus according to any of the above described embodiments is provided further comprising at least one heat source disposed to effect heating of the substrate with the substrate disposed on the table.

The above, and other objects, features and advantages of the present disclosure will become apparent from the following description read in conjunction with the accompanying drawings, in which like reference numerals designate the same elements. The present disclosure is considered to include all functional combinations of the above described features and corresponding descriptions contained herein, and all combinations of further features described herein, and is not limited to the particular structural embodiments shown in the figures as examples. The scope and spirit of the present disclosure is considered to include modifications as may be made by those skilled in the art having the benefit of the present disclosure which substitute, for elements presented in the claims, devices or structures upon which the claim language reads or which are equivalent thereto, and which produce substantially the same results associated with those corresponding examples identified in this disclosure for purposes of the operation of this disclosure. Additionally, the scope and spirit of the present disclosure is intended to be defined by the scope of the claim language itself and equivalents thereto without incorporation of structural or functional limitations discussed in the specification which are not referred to in the claim language itself.

The foregoing is a summary and thus contains, by necessity, simplifications, generalizations, and omissions of detail; consequently, those skilled in the art will appreciate that the summary is illustrative only and is not intended to be in any way limiting. Additional features and advantages of various embodiments of the present disclosure will be set forth in part in the non-limiting description that follows, and in part, will be apparent from the non-limiting drawings, or may be learned by practice of various embodiments. The objectives and other advantages of various embodiments will be realized and attained by means of the elements and combinations particularly pointed out in the description and appended claims.

BRIEF DESCRIPTION OF THE DRAWINGS

In part, other aspects, features, benefits and advantages of embodiments of the present disclosure will be apparent with regard to the following description, appended claims and accompanying drawings wherein:

FIG. 1A is a top plan view of a PCB;

FIG. 1B is a bottom view of the PCB of FIG. 1a;

FIG. 1C is a top plan view of the PCB of FIG. 1a showing the bottom view of FIG. 1B in dashed lines;

FIG. 2 is a side elevation view of a cross section of the PCB of FIG. 1C;

FIG. 3 is a side elevation view of a cross section of multilayer PCB;

FIG. 9b is a diagram of a circuit trace defined by the PCB trace defining method shown in FIG. 9a;

FIG. 16b is side elevation view of another component tray and a holding frame of the present disclosure;

FIG. 16c is a top plan view of the component tray and the holding frame of FIG. 16b;

FIG. 16d is a top plan view of another component tray and the holding frame of FIG. 16b;

FIG. 16e is a perspective view of another component tray of the present disclosure;

FIG. 16f is a perspective view of another component tray of the present disclosure;

FIG. 16g is a perspective view of another component tray of the present disclosure;

FIG. 16h is a perspective view of a standard component;

FIG. 16i is a perspective view of another component tray of the present disclosure;

FIG. 17a is a cross-sectional view of a substrate with conductive and non-conductive traces produced in accordance with a method of the present disclosure;

FIG. 17b is a cross-sectional view of another substrate with conductive and non-conductive traces produced in accordance with another method of the present disclosure;

FIG. 18a is a view of exemplary circuit traces;

FIG. 18b is a view of the exemplary circuit traces of FIG. 18a with indicia indicating a method of the present disclosure;

FIG. 18c is a view of the exemplary circuit traces of FIG. 18a with further indicia indicating the method of the present disclosure discussed with reference to FIG. 18b;

DETAILED DESCRIPTION

For the purposes of this specification and appended claims, unless otherwise indicated, all numbers expressing quantities of ingredients, percentages or proportions of materials, reaction conditions, and other numerical values used in the specification and claims, are to be understood as being modified in all instances by the term "about." Accordingly, unless indicated to the contrary, the numerical parameters set forth in the following specification and attached claims are approximations that may vary depending upon the desired properties sought to be obtained by the embodiments of the present disclosure. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all subranges subsumed therein. For example, a range of "1 to 10" includes any and all subranges between (and including) the minimum value of 1 and the maximum value of 10, that is, any and all subranges having a minimum value of equal to or greater than 1 and a maximum value of equal to or less than 10, e.g., 5.5 to 10.

It is noted that, as used in this specification and the appended claims, the singular forms "a," "an," and "the," include plural referents unless expressly and unequivocally limited to one referent. Thus, for example, reference to "a member" includes one, two, three or more members.

Reference will now be made in detail to various embodiments of the present disclosure, examples of which are illustrated in the accompanying drawings. While the embodiments of the present disclosure will be described in conjunction with the illustrated embodiments, it will be understood that they are not intended to limit the disclosure to those embodiments. On the contrary, the disclosure is intended to cover all alternatives, modifications, and equivalents, which may be included within the disclosure as defined by the appended claims.

The headings below are not meant to limit the disclosure in any way; embodiments under any one heading may be used in conjunction with embodiments under any other heading.

Overview.

Figure 4:
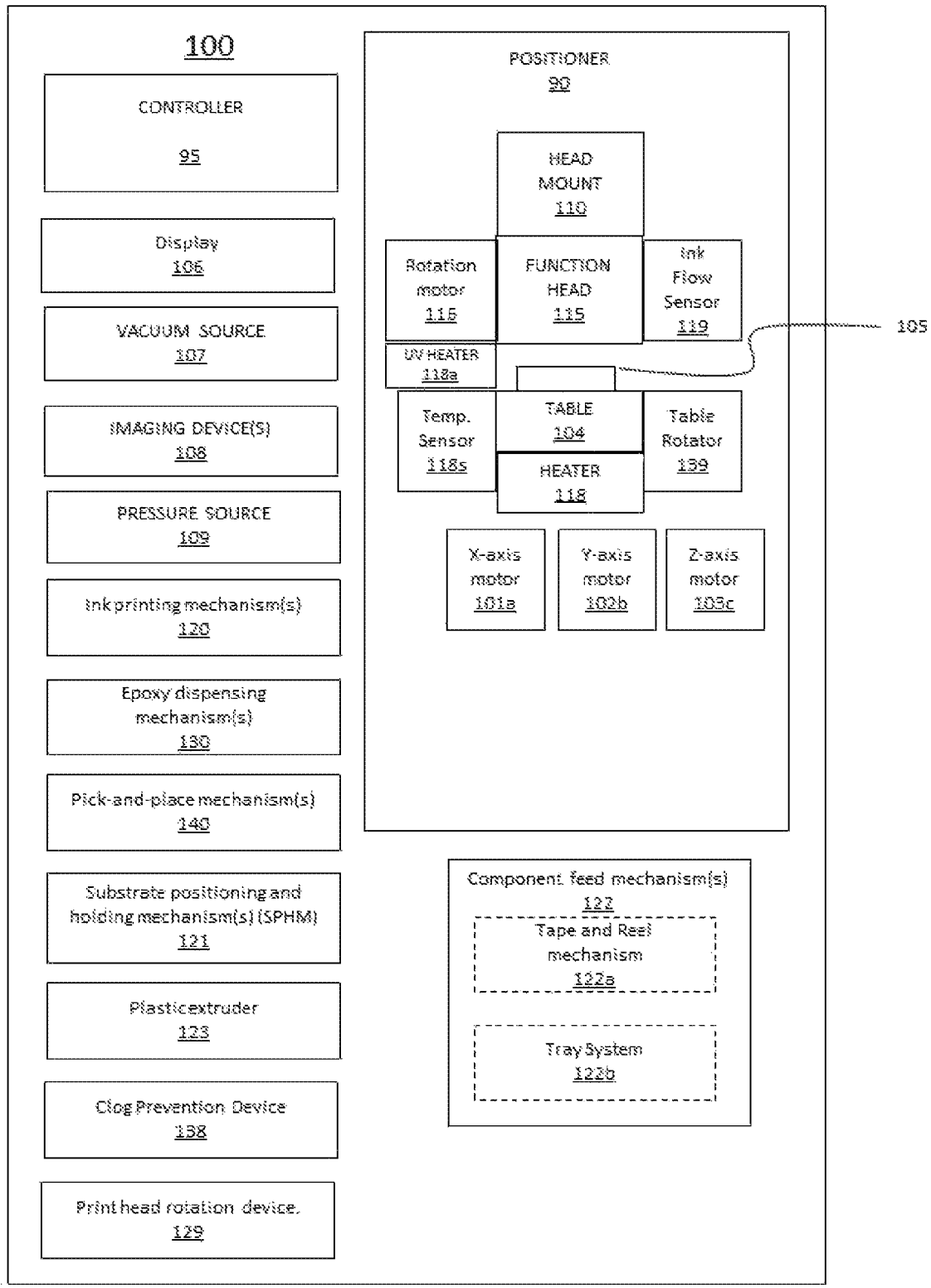
FIG. 4 is a block diagram of an embodiment of a PCB production apparatus 100 of the present disclosure.
Figure 7:
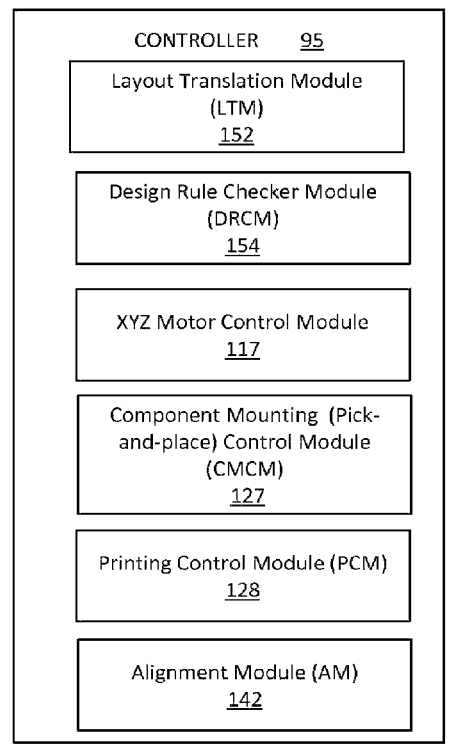
FIG. 7 is a block diagram of functional modules of a controller of the present disclosure.

Referring to FIG. 4, an embodiment of the present disclosure includes a printed circuit board (PCB) production apparatus 100 comprising a positioner 90, a controller 95, a display 106, a vacuum source 107, and an imaging device 108. The positioner 90 further comprises a head mount 110, a function head 115, and a table 104. The positioner operates to effect three axis movement of the function head 115 relative to the table 104 as directed by the controller 95. The table 104 is configured to support a substrate 105 which is a workpiece to be fabricated into a PCB. A component feed mechanism 122 and a component mounting head 140, e.g., a pick-and-place mechanism, are optionally provided. The component feed mechanism 122 may be embodied as a tape and reel mechanism 122a or a tray system 122b, or both either simultaneously or interchangeably. Details of the controller 95 are depicted in FIG. 7 and include a component mounting control module (CMCM) 127 which controls operations of the component mounting head 140 and the component feed mechanism 122 when the PCB production apparatus 100 is so equipped.

Figure 5A:
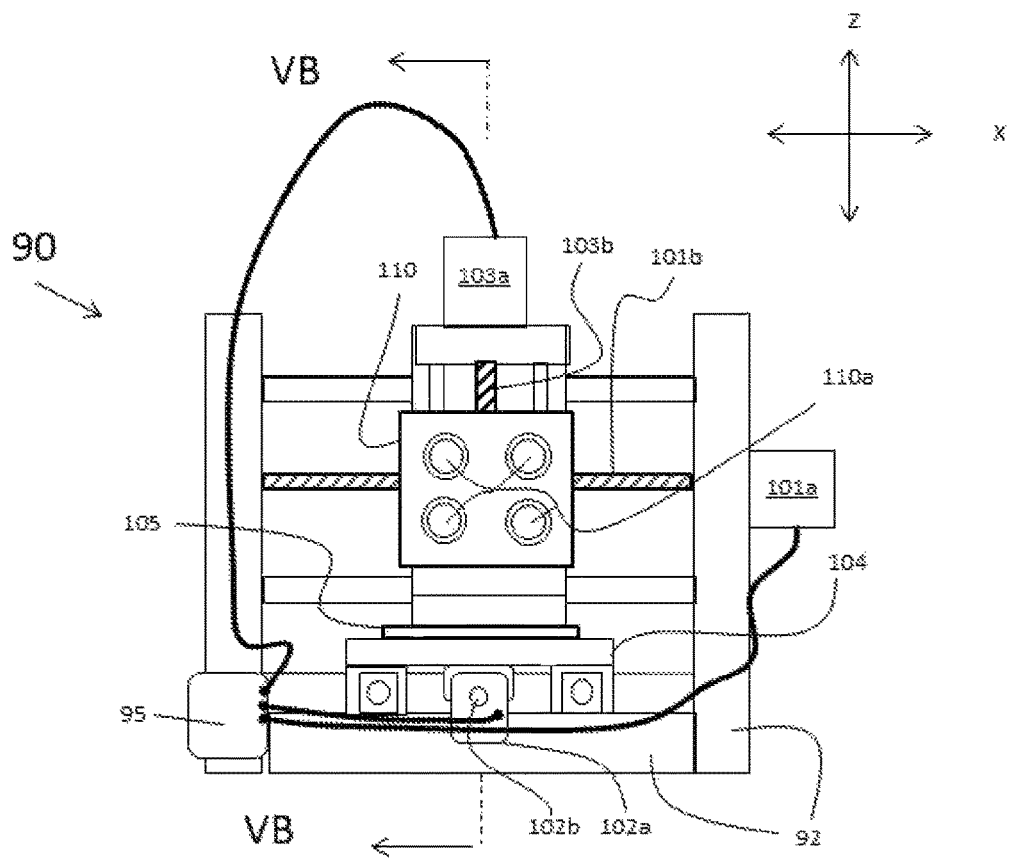
FIG. 5A is a schematic representation of the PCB production apparatus 100 of FIG. 4.
Figure 5B:
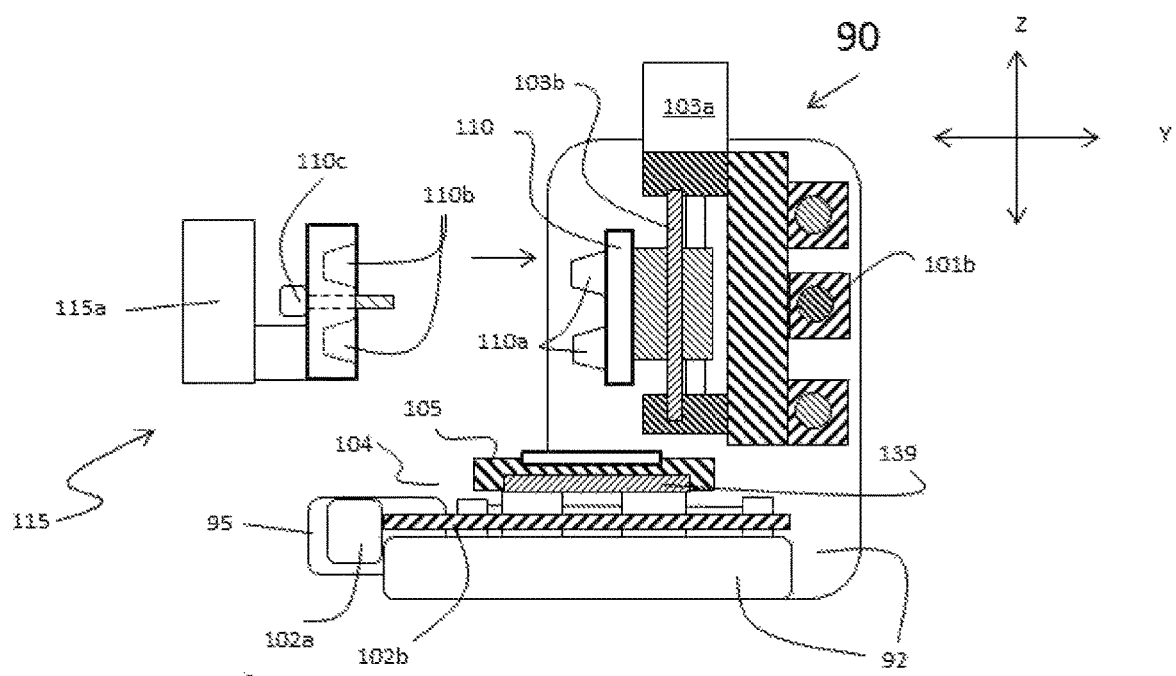
FIG. 5B is a side elevation view the PCB production apparatus 100 of FIG. 5A taken along line VB-VB.

Referring to FIGS. 5A and 5B, a simplified, schematic in part, depiction of an embodiment of the positioner 90 illustrates a basic configuration of a positioner. The present disclosure is not restricted to the configuration illustrated, and it will be understood by those skilled in the art that other positioner configurations are optionally adaptable for use in the PCB production apparatus 100 provided the configurations are capable of positioning the function head relative to the substrate 105 in x, y, and z axis directions. Motion along each axis is optionally implemented by a motor and a lead screw. Other optionally employable actuation mechanisms include, for example and not limitation, linear motors and motors operating, inter alia, belts and pulleys, and rack and pinions. In the embodiment of FIGS. 5A and 5B, an x-axis motor 101a drives an x-axis lead screw 101b, a y-axis motor 102a drives an x-axis lead screw 102b, and a z-axis motor 103a drives an z-axis lead screw 103b. The head mount 110 is vertically moved by the z-axis lead screw 103b and is horizontally moved in the x-axis by the x-axis lead screw 101b. The table 104, which supports the substrate 105, is horizontally moved in the y-axis direction by the y-axis lead screw 102b. The table 104 is optionally mounted to permit rotation in an embodiment including table rotator 139 which may be embodied as a motor, solenoid, field coil, or other actuator.

The function head 115 optionally mounts to the head mount 110 by mount screw 110c and is aligned by virtue of alignment cones 110a mating with alignment cavities 110b. Other mounting configurations may be adapted without departing from the scope of the present disclosure. The function head 115 has a function module 115a which is optionally configured to effect any or all of ink dispensing, epoxy dispensing, or component placement as is discussed below. The PCB production apparatus 100 is capable of printing circuit traces and/or performing pick-and-place attachment of electrical components. The PCB production apparatus 100 is optionally used for low-cost rapid prototyping and rapid manufacture of complete printed circuit assemblies.

As is elaborated upon below, an embodiment of the PCB production apparatus 100 comprises a function module 115a configured as a printing device for printing conductive material onto the substrate 105. The PCB production apparatus 100 is also optionally capable of positioning circuit components onto the substrate 105 in electrical connection to the conductive material with the function module 115a configured for component mounting as discussed below. In some applications, attachment of circuit components to the substrate 105 and conductive material may include application of a conductive epoxy and the function module 115a is optionally configured with the epoxy dispenser 130. An embodiment of the PCB production apparatus 100 is also capable of applying non-conductive epoxy at specific locations on the substrate 105. If heat curing is optionally used for proper operation of the conductive material and epoxy, an embodiment of the PCB production apparatus 100 optionally includes heater 118 which is a source of heat which is applied under the control of the controller 95. For lightweight and/or flexible substrates, an embodiment of the PCB production apparatus 100 optionally includes a substrate positioning/holding mechanism 121 for temporarily holding substrate 105 to table 104 which, in one embodiment, includes the vacuum source 107. The PCB production apparatus 100 optionally includes the imaging device 108 for implementing a scanning, or digitizing, function for creating a digital model of an arbitrary three dimensional structure for aiding in the positioning of the ink printing and component placement. A further embodiment of the PCB production apparatus 100 optionally includes a material printing function for printing plastic and/or metal structures for supporting and/or enclosing the PCA.

Controller.

The controller 95 controls functions of the PCB production apparatus 100, including the movement of the head mount 110 relative to substrate 105, and is implemented by software and/or firmware which resides internal to the PCB production apparatus 100, external to the PCB production apparatus 100, or split between the two, where some functions reside external to the PCB production apparatus 100 and some functions reside internal to the PCB production apparatus 100. To aid in the readability of this document, all software and/or firmware references related to the operation of the PCB production apparatus 100 will be referred to as firmware. In some cases, firmware will be referring to an application module that is part of the complete the PCB production apparatus system software or the firmware will be referring to application modules that are optionally operated as stand-alone software applications. Firmware will reside in the controller 95 which is integrated into the PCB production apparatus 100. The controller 95 may be any of a microcontroller, a single board computer capable of producing signals to control the movement of head mount 110, or a standalone computer, such as but not limited to a PC, which has an I/O unit configured to control components of the PCB production apparatus 100 such as any one or combination of the x-axis motor 101a, the y-axis motor 102a, the z-axis motor 103a, the function head 115, the imaging device 108, and the pressure source 109.

It will be understood by those skilled in the art that the controller 95, although depicted as a module within the PCB production apparatus 100 in FIG. 4, is optionally implemented in a distributed fashion wherein a control module is internal to the PCB production apparatus and a computer, separate from but in electronic communication with the internal control module, operate in conjunction with each other to effect control of the PCB production apparatus 100. For the purposes of this disclosure, the term "controller" is intended to include such an arrangement as well as an arrangement wherein a computer is external to the PCB production apparatus 100 but controls operation of components of the PCB production apparatus 100 as discussed above via an I/O unit. In such an embodiment, the computer is to be considered a portion of the PCB production apparatus 100.

Function Head.

Referring to FIG. 6, in an embodiment, the function head 115 includes an ink printing mechanism 120 for printing conductive traces by dispensing of conductive inks onto the substrate 105. The ink printing mechanism 120 is attached to the PCB production apparatus 100 at head mount 110. Dispensing conductive ink using the ink-printing mechanism 120 includes, but is not limited to, processes such as syringe printing, piezoelectric-based printing, ink-jet printing and ink spray. Some printing techniques, such as syringe printing, require the application of air pressure provided by optional pressure source 109, shown in FIG. 4, or mechanical pressure applied by an electric motor or other actuator to push the ink through the ink nozzle.

Conductive inks are typically silver and copper-based but could be of any ink that would provide reasonable conductivity for transfer of electrical signals across the conductive traces. An example of a commercially available silver-based conductive ink is Metalon HPS-021LV from Novacentrix. The HPS-021LV has a resistivity of 6.74e-5 ohm-cm when the ink is cured at 125 degrees-C. There are several other manufacturers of conductive inks that are optionally used when printing conductive traces using the ink-printing mechanism 120 described in this disclosure.

The ink-printing mechanism 120 may include a nozzle or tip with an opening for the ink to flow through. The ink-printing mechanism 120 may be capable of having the tip replaced should a larger or smaller width line be required by the circuit.

Other commercially available conductive inks are capable of being printed using standard ink jet printing techniques. These types of inks are typically based on nano-particles which allow the ink to be ejected from small holes characteristic of a standard ink-jet cartridge or piezeoelectric nozzle. Here the conductive ink is optionally filled in an ink-jet cartridge and the PCB production apparatus 100 controls the release of conductive ink onto the substrate 105.

Movement of the head mount 110 relative to the table 104, is controlled by the controller 95 based on information contained in a digital model or image of a desired conductive trace geometry or circuit layout. Details of the circuit layout is often contained in an industry-standard Gerber file or any other type of file which supports the desired geometry of the conductive traces. File types may include electronic image files including bitmaps (BMP), JPEGs, GIFs and TIFFs to name a few. The position of the head mount 110 is optionally manually controlled by the operator via the controller 95.

Figure 6A:
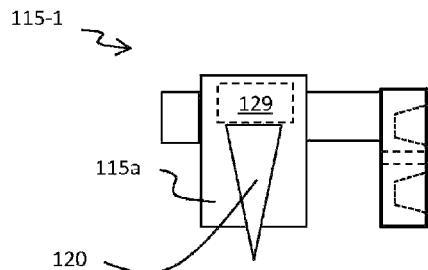
FIG. 6a is a partial schematic view of a function head of the present disclosure.
Figure 6B:
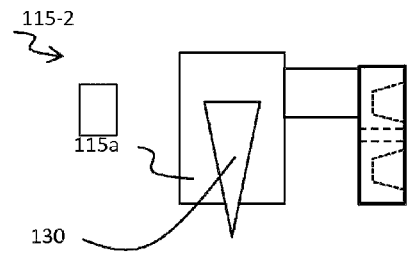
FIG. 6b is a partial schematic view of another function head of the present disclosure.
Figure 6C:
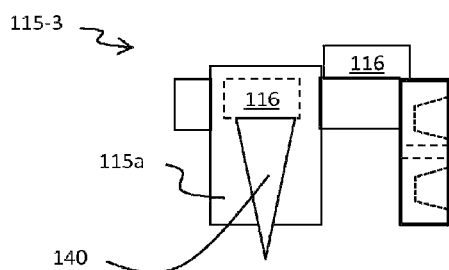
FIG. 6c is a partial schematic view of another function head of the present disclosure.
Figure 6D:
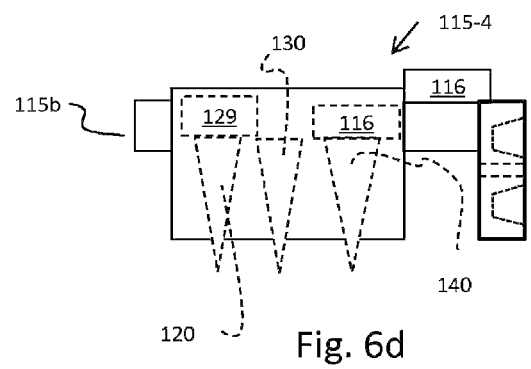
FIG. 6d is a partial schematic view of another function head of the present disclosure.
Figure 6E:
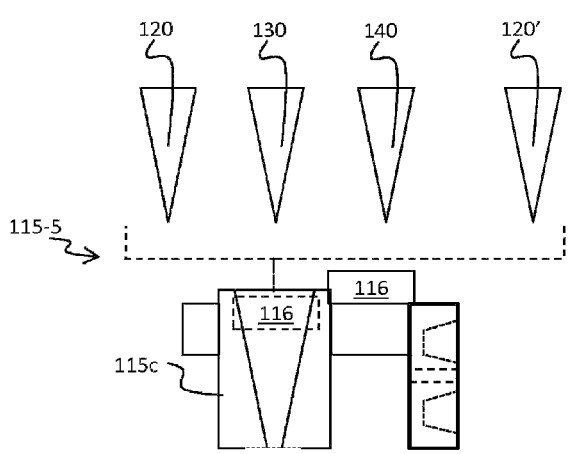
FIG. 6e is a partial schematic view of another function head of the present disclosure.

At any one time, embodiments of the function head 115 will contain at least one of the following PCB production mechanisms: the ink-printing mechanism 120 in a function head 115-1 of FIG. 6a, an epoxy-printing mechanism 130 in a function head 115-2 of FIG. 6b, and/or a pick-and-place mechanism 140 in a function head 115-3 of FIG. 6c. Alternatively, an embodiment of a function head 115-4 optionally has a function head module 115b which includes all or any combination of functions as shown in FIG. 6d. The function head module 115b is also optionally configured to include two functions instead of three. Alternatively, as shown in FIG. 6e, an embodiment of the present disclosure includes a function head 115-5 having a function head module 115c configured to be automatically or manually loaded with any of the PCB production mechanisms 120, 130, or 140 based on a desired operation and optionally under firmware control.

The function head 115 optionally has a rotation motor 116 (dashed line representation) to rotate the pick-and-place mechanism 140 or the pick-and-place mechanism 140 includes the rotation motor 116 (dashed line representation) to implement a rotation feature to properly position the electrical component onto the substrate 105. Another embodiment has the rotation motor 116 (solid line representation) mounted outside of the function head module 115a, 115b, or 115c so as rotate the whole function head module 115a, 115b, or 115c. Alternatively, the rotation motor 116 (dashed line representation) may be mounted on the function head module 115a, 115b, or 115c so as to rotate the function head module 115a or 115b relative to the function head 115-3, 115-4, or 115-5.

In an embodiment, the function head 115b includes the ink-printing mechanism 120 and the pick-and-place mechanism 140. The function head 115b optionally has a print mechanism rotation device 129 (dashed line representation) to rotate the printing mechanism 120 or the printing mechanism 120 includes the rotation device 129 (dashed line representation) to implement a rotation feature to orient a print head as discussed below with regard to circuit trace printing. The print head rotation device 129 is optionally embodied as motor but other actuating devices such as solenoids, voice coils or pneumatic actuators operating off the vacuum source may be used. The embodiment of the function head 115b having the rotation motor 116 (solid line representation) mounted outside of the function head module 115a, 115b, or 115c so as rotate the whole function head module 115a, 115b, or 115c, is also optionally adapted to print head orientation.

The function head 115b may include several ink-printing mechanisms, one for each printing type, including mechanisms for conductive ink printing, insulator ink printing and epoxy deposition to name a few. The individual printing and deposition mechanisms may share common parts such as a syringe motor or pressure sensor to name a few. In one configuration, the function head 115b allows substitution of one ink type for another, such as a case when a syringe that contains the conductive ink is replaced with a syringe containing the insulating ink. Having the flexibility to replace ink containers may reduce the total cost of the PCB production apparatus 100.

In some applications, it may be beneficial to have a complete inking mechanism for each type of ink and epoxy. For example, some ink and epoxy products are two-part systems containing a base material and a catalyst. In this case, a separate mechanism is optionally used to apply the two parts to substrate 105. The epoxy may include conductive and non-conductive forms. Conductive epoxy is optionally used for making an electrical contact between the component and the conductive traces. Non-conductive epoxy is optionally used for holding components and devices to the surface of substrate 105 and the conductive traces.

The epoxy is optionally thermally conductive for applications requiring the dissipation of heat. The epoxy will be dispensed using an epoxy-printing mechanism. The epoxy-printing mechanism may be of the same type as the ink-printing mechanism. The epoxy-printing mechanism may be of a different type than the ink-printing mechanism. For example, the ink-printing mechanism may include an ink jet technology while the epoxy-printing mechanism may include a syringe printing process. Another example may have the ink-printing mechanism using a single tip dispensing process while the epoxy-printing mechanism optionally uses a dual tip dispensing system when a two-part epoxy is optionally used. These are not the only combinations of dispensing types but are used here to describe some possible variations in dispensing techniques.

Substrate.

The substrate 105 is optionally of any type of non-conductive material to which the conductive traces may be firmly attached and cured. The substrate material may be rigid or flexible, for example and not limitation, fiberglass boards, paper, plastic, wood, glass, cloth, or skin. Referring to FIGS. 5A and 5B, the substrate 105 is supported within the PCB production apparatus 100 using the table 104. The table 104 is typically a flat rigid plate which is attached to the PCB production apparatus 100. The table 104 is optionally made from a variety of materials including, but not limited to, plastics, metals and fiberglass board. The table 104 is optionally removable.

Table.

The table 104 optionally also includes a three-dimensional form onto which substrate 104 will be held. The form is optionally a shape that is cylindrical, hemispherical, conical or rectangular to name a few, other shapes are also possible. The limitation in the shape form is only dictated by the flexibility of the PCB production apparatus 100 to printing ink onto a complex structure.

The table 104 may be fixed in location relative to an apparatus frame 92 or may physically move in one or more dimensions under the control of the firmware in order to aid in the printing of inks and insulators. The PCB production apparatus 100 as shown in FIGS. 5A and 5B, is configured with table 104 movement along the y-axis relative to the apparatus frame 92. The y-axis motor 102a is attached to the lead screw 102b which moves table 104 when motor 102a is turned. When the y-axis motor 102a moves the table 104, the relative position to the head mount 110 to the table 104 is changed. The x-axis motor 101a is connected to the lead screw 101b and moves the head mount 110 along with the z-axis motor 103a and lead screw 103b relative to the frame 92 and the table 104 along the x-axis. The z-axis motor 103a drives another lead screw 103b to move the head mount 110 in the vertical direction along the z-axis relative to the table 104 and the frame 92. Having three axis of motion allows the head mount 110 to be positioned anywhere across table 104 and the substrate 105. An alternative embodiment of the PCB production apparatus 100 movably supports the table 104 to move in both in the x-axis and y-axis directions relative to the frame 92 and the head mount 110 to move in the z-axis relative to the frame 92. One skilled in the art will understand that there are numerous other combinations for three dimensional movement of the table 104 relative to head mount 110 and will appreciate that such configurations are within the scope of this disclosure.

PCB Production Files.

PCB production techniques produce conductive traces that follow a circuit pattern required for an electronic circuit with details defining the circuit pattern saved in an electronic file. The information contained in the pattern, also called the layout, may be recalled through the firmware from an electronic database and transferred to the apparatus controller 95 by the operator. In typical applications, the layout would be designed and saved using a separate Computer Aided Design (CAD) tool such as Cadence OrCAD, CadSoft Eagle and Mentor Graphics PADS to name a few. In an embodiment of the present disclosure, the CAD tool is optionally integrated as part of the PCB production apparatus firmware. The CAD tools may output the circuit layout in the form of native file types, Gerber, or some other standardized file type. For example, a Gerber file is a data file describing the physical layout of a single layer of a printed wiring board. These layout file types may also include Bitmaps (BMP), JPEGs, GIFs and TIFFs to name a few. The Gerber file is an industry standard used in the fabrication of chemically etched and mechanically etched printed wiring boards. To improve the readability of this document, the term Gerber will be used to describe any type of electronic file that describes the layout of a single layer of printed wiring board including vector and image based electronic files. However, it will be understood that the present disclosure includes any other file type defining a circuit layout when using the name. Gerber unless explicitly limited to a Gerber file. To completely describe a PCB, a set of Gerber files is often required including files that may define conductive and non-conductive features of the printed wiring board. These files may also include the physical location of individual components. In a multilayer printed wiring board, several Gerber files are required to describe each layer in the complete board. In general, the generic term "PCB file" will be used hereinafter to refer to a file describing circuit layout features directed to single or multilayer PCB to be manufactured using conventional methods, such as a Gerber file. The term "printed PCB file" will be used to refer to a file configured to control the PCB production apparatus 100 for producing a PCB using the method of the present disclosure for printing circuitry incorporating multiple layers using printing techniques.

Layout Translation Module.

Firmware of the controller 95 will optionally include a layout translation module (LTM) 152 to translate the PCB files into instructions for controlling a location of head mount 110 and each of the associated operations of the PCB production apparatus 100 including the ink-printing mechanism 120, epoxy-printing mechanism 130 and the pick-and-place mechanism 140. The LTM 152, implemented by PCB file translation-software, may reside external to the PCB production apparatus 100 or included as part of the firmware. When the translation-software is external to the PCB production apparatus 100, it may reside in a local personal computer, reside in a web-based tool or any other computing device capable of inputting electronic data files and performing the translation from layout of conventional PCB files to files for controlling the PCB production apparatus 100, hereinafter referred to as apparatus layout files (ALFs), which define the conductive and nonconductive geometries and traces to be produced by the PCB production apparatus 100. Taken a further step, the ALFs may subsequently be translated into apparatus control files (ACFs) which are commands for controlling the PCB production apparatus 100 to produce the PCB. The ACFs may be created "on the fly" from the ALFs to control the PCB production apparatus 100 in the manner that interpreters accept source code and effect program functions without first compiling source code.

In an alternative embodiment of the PCB production apparatus 100, the LTM 152 of FIG. 7 is included within a CAD tool that examines the conductive layers and creates a separate PCB file that includes the insulating geometries to separate at least two conductive layers. The generation of a PCB file containing the insulating geometries is optionally independent of the firmware of the PCB production apparatus 100 in this embodiment. In the embodiment of FIG. 7, firmware of the PCB production apparatus 100 includes the LTM 152 and imports PCB files, inter alia, Gerber files, for two or more conductive layers and determines the insulating geometries for the non-conductive ink.

Design Rule Checker.

A Design Rule Checker module (DRCM) 154 is optionally employed to verify that the CAD file and/or printing instructions is compatible with control of the PCB production apparatus 100 and also within limits for printing conductive and non-conductive traces defined by limits of the PCB production apparatus 100, for example and not limitation, line width, line spacing and overlap. The DRCM 154 may also check the capability for printing conductive epoxy. In an embodiment, the DRCM 154 is included as an option in the CAD software tool. In another embodiment the DRCM 154 is included as part of the firmware so that the PCB production apparatus 100 can check files from CAD tools not specifically equipped to provide files for the PCB production apparatus 100.

Intersection Determination and Isolating Layers.

In producing two-layer and multi-layer PWBs using the PCB production apparatus 100, it may be necessary to print insulating inks when two or more conductive lines must cross over each without making electrical contact. The insulating ink replaces the function of the built-in isolation achieved with substrate 52 shown in FIG. 2. In this case, there are at least two PCB files to describe each layer in the complete PCB. The LTM 152 has a function that will process the PCB files to identify the need for an insulating layer by locating a position of circuit traces of different layers that intersect when the PCB is viewed from the z-axis direction in order to generate an insulator geometry for electrically isolating intersecting conductive traces when producing the PCB using the PCB production apparatus 100.

Figure 8:
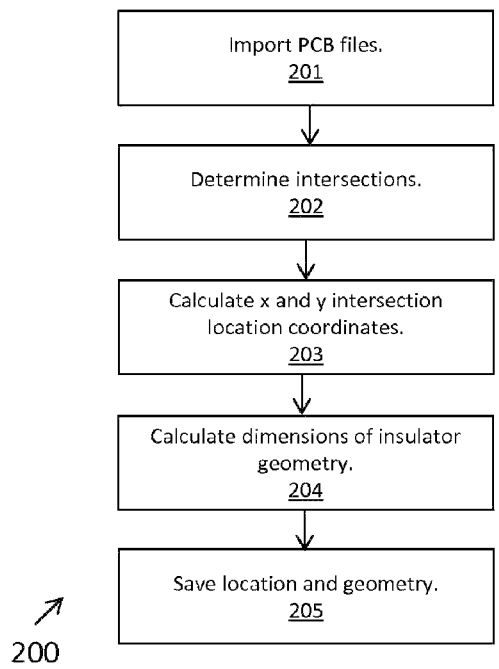
FIG. 8 is a flowchart of an embodiment of operations of a layout translation module of the present disclosure.

The LTM 152 optionally creates a list of locations where insulating ink is to be deposited onto the substrate 105 covering a first circuit feature and preventing electrical connection between the first circuit feature and those that cross over the first circuit feature. The list may include a width and length of the insulator geometry formed by printed insulating ink. Referring to FIG. 8, an insulator generation process (IGP) 200 is a multistep process which includes importing the PCB files 201, examining the PCB files for intersections 202, calculating x, y location coordinates for each intersection 203, calculating length and width of insulating geometry 204, saving location and geometry information 205 for later use by the PCB production apparatus 100 to print non-conductive ink.

When examining conventional PCB files which contain layout geometry for two or more different conductive layers in a PWB, it is important to identify lines from separate layers that would cross over, intersect or overlay is some way when printed with conductive ink absent intervening board layer(s) of conventional PWBs. A standard Gerber file includes information contained in the header followed by a description of the geometry. For example, a single trace would have the following text-based file stored in the format of a Gerber file.

%FSLAX25Y25*%
%MOIN*%
%IPPOS*%
%ADD10C,0.05*%
%LPD*%
X0Y0D2*D10*G1X84464Y145472D2*
X113885D1*X0Y0D2*M02*

The file begins with % FSLAX25Y25*% which describes the coordinate format of Leading Zero's omitted, Absolute Coordinates, 2 Digits in the Integer Part and 5 Digits in the Fractional Part. The % MOIN*% represents the units set to inches. % IPPOS*% sets the image to have positive polarity. The %ADD10C,0.05*% defines an aperture with D-code 10 as a 0.05-inch circle. The % LPD*% Start a new level with dark polarity. The X0Y0D2*D10* commands a move to (0,0) and select aperture D10. G1 command is for linear interpolation. The Command X84464Y145472D2 is a move to (0.84464", 1.45472"). Command X113885D1 is draw to (1.13885", 1.45472"). The X0Y0D2 commands a move to (0,0). The M02 is the end of file.

Figure 9A:
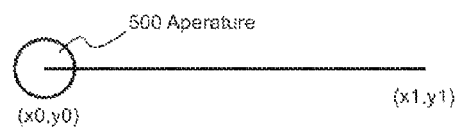
FIG. 9a is a diagram of a PCB trace defining method.
Figure 9B:

Referring to FIG. 9a, an example of a line defined by a Gerber file with two end points of a line are shown as (x0,y0) and (x1,y1). An aperture 500 is defined using the aperture definition in the Gerber file. The final geometry is created by moving the aperture 500 from endpoint (x0,y0) to (x1,y1). It should be noted that circular apertures are not the only types available in Gerber formats, squares, rectangles and almost any shape is optionally assigned to an aperture according to the 274X specification. Referring to FIG. 9b, the geometry of the first conductive trace 501 based on the information shown in FIG. 9a is shown. The first conductive trace 501 is the geometry that will be printed using either the PCB production apparatus 100 or conventional PCB manufacturing equipment. When Gerber files from two or more conductive layers are to be printed on a substrate, it is assumed that there will be overlap between portions of at least one pair of conductive traces.

There a several ways to determine overlap between traces from two or more layers. An imaging method is optionally used to convert the conductive trace 501 to a graphics or image file and compare the information contained in this image file to the information contain in another image file. Another method optionally employed is to mathematically determine the location of the overlap using mathematical techniques known in the industry which compare line segments for overlap or touching. Mathematical techniques must also include aperture inclusion wherein the width of the aperture that runs along the centerline of the trace including the extension beyond the endpoints of the line created by the radius of the aperture at each end.

Figure 9C:
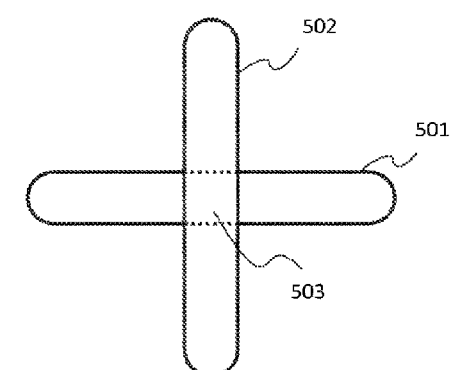
FIG. 9c is a diagram of a PCB traces.

Referring to FIG. 9c, in using the imaging method, the first conductive trace 501 is converted to an image file and the second conductive trace 502 is converted to an image file. In the operation 202 of FIG. 8, the imaging technique may be used wherein the images are aligned and a pixel by pixel comparison is made until first overlap 503 is determined. Alternatively, the mathematical technique may used wherein a conductive intersection is optionally determined by examining a vector representation of the first conductive trace 501 and the second conductive trace 502. In an embodiment of the mathematical technique, matrix calculating methods are optionally employed using determinants. It will be understood that other techniques for calculating the conductive intersection 503 are optionally developed including when conductive intersection 503 includes shapes such as square, rectangular and other complex geometries.

In operation 203, the coordinates of the intersection are determined based on the technique used to find the intersection. In an embodiment of operation 203, the area of the first overlap 503 is stored as another image file based on the total number of pixels and layout of the pixels. Another embodiment of operation 203 includes a technique to store the first overlap 503 in terms of a centroid, length and width. As not all overlaps are rectangular, as in the case when diagonal lines are present, the geometry of a complex overlap may be stored.

Insulating Geometry.

Once the overlap, i.e., intersection, is determined, operation 204 is effected wherein a new geometry for an insulator is created that matches or is slightly larger than the geometry of the overlap 503. When printing two conductive traces that should be electrically isolated, it is advantageous to oversize the overlap geometry to prevent the possibility that the two conductive traces will short together. Referring to FIG. 9c, an insulating patch 504 is designed to be slightly larger than first overlap 503. When printing conductive traces 501 and 502, insulating patch 504 will be printed between them to create a layer of insulation. This is likewise shown in FIG. 10a wherein the insulating patch 213 is depicted.

Figure 10A:
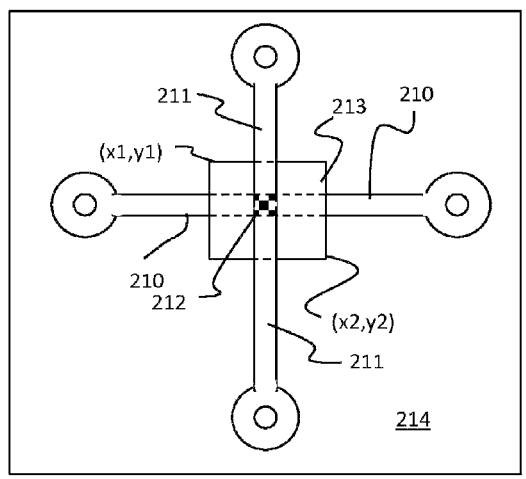
FIG. 10a is a plan view of a PCB including the insulating patch of the present disclosure.

Referring to FIG. 10a, it is optionally provided that an approximate area and location for the overlap be determined in order to calculate an appropriate size of the insulating geometry 213. As shown in FIG. 10a, the insulating geometry 213 is shown as a square with center xc, yc and associated width (x2-x1) and length (y2-y1). Insulating geometry 213 can also be represented by corner points (x1,y1) and (x2,y2). The insulating geometry 213 is not limited to square geometries and is optionally of any shape large enough to electrically isolate the conductive trace 210 from the conductive trace 211.

Creating Isolated Insulated Intersecting Traces.

Returning to FIG. 9d, the process to create insulating patch 504 starts with the geometry of first conductive trace 501 and geometry of second conductor 502. These geometries are optionally stored as part of a software tool that routes conductive traces onto separate layers. These routing tools create the layout geometries that will be converted to commands used by apparatus to print conductive ink. Another option would be to recall two Gerber files that contain the appropriate layout information for first conductive trace 501 and second conductive trace 502.

The insulator geometry operation 204 uses the overlap geometry determined using image-based techniques or mathematically techniques in operations 202 and 203. An example of the insulator geometry is the insulator patch 504 of FIG. 9d. In an advantageous configuration, the insulating patch 504 is configured using an oversize dimension that, in one embodiment, is at least 0.005-inch larger than the overlap geometry 503 however this is not a requirement as other oversize dimensions may be used. The actual size of the insulating patch is a function of the printing capability of the apparatus including print resolution for both the conductive and non-conductive inks. The sizing of the insulating patch is optionally automatically determined or input by the operator such as a manually introduced setting that the insulating patch to be 0.005-inch beyond the nearest point to the overlap geometry 503.

The creation of the insulator geometry of the insulating patch 504 is performed by the LTM 152 in operation 204 or is optionally performed in a software tool that routes the layout. Once the layout information for the insulating patch is determined, it is stored as an image file or as a Gerber file for use by the PCB production apparatus 100 during the multilayer printing process. If the layout information is determined by the LTM 152, it is optionally used to directly control the printing-mechanisms in apparatus.

Creating Insulated Regions of Intersecting Traces.

Figure 10B:
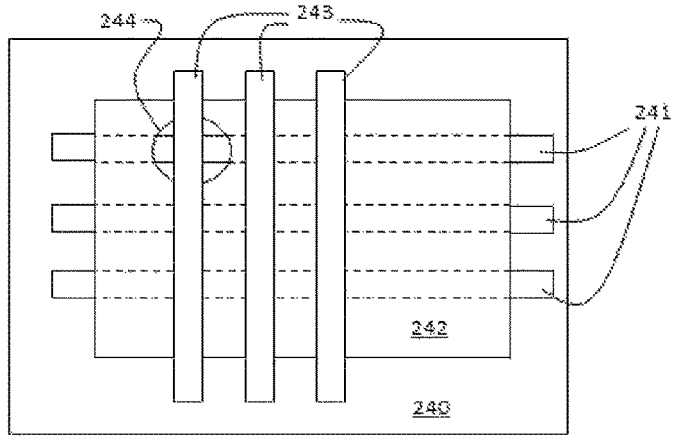
FIG. 10b is a plan view of a PCB including another insulating patch of the present disclosure.

Another form of insulating two conductive layers is to print an entire region of insulating ink between the two conductive layers. Referring to FIG. 10b, a first conductive layer 241 is first printed on a substrate 240. Insulating layer 242 is then printed on top of first conductive layer 241 to cover at least a portion of the conductive traces of first conductive layer 241. Second conductive trace layer 243 is printed on top of insulating layer 242. The geometry of insulating layer 242 is determined by examining the Gerber files of first conductive layer 241 and second conductive layer 242. In some cases, the geometry of insulating layer 242 may be optimized to reduce ink usage and time printing the non-conductive ink, or the insulating patch technique discussed above may be employed. In some cases, it is preferred to completely cover the substrate 240 with insulating layer 242.

Printing Insulated Intersecting Traces.

Figure 11:
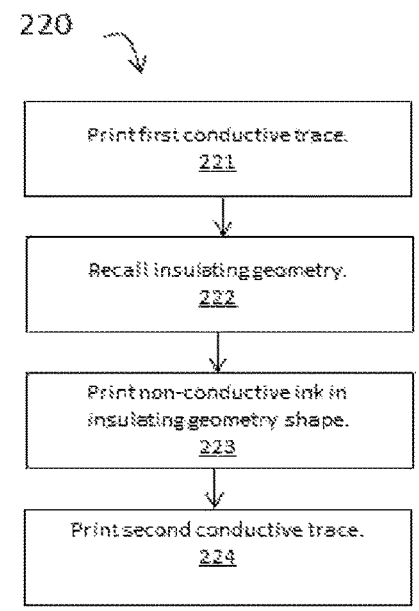
FIG. 11 is a flowchart of a circuit printing method of the present disclosure.

Referring to FIG. 11, a multilayer printing process 220 is shown for printing two conductive traces separated by an insulating layer shaped with a geometry that electrically isolates the two conductive lines. The multilayer printing process 220 starts with printing a 1st conductive trace in operation 221, followed by recalling the insulating geometry 222 which has been defined in operation 222, followed by operation 223 printing non-conductive ink in the shape of the insulating geometry 223 and lastly, printing 2nd conductive trace 224. The function head 115b of FIG. 6d optionally includes two of the ink-printing mechanisms 120 respectively containing conductive and non-conductive inks in the same subsystem. Alternatively, the function head 115a has a single one of the ink-printing mechanisms 120 with the conductive ink and non-conductive ink being exchanged during the printing process. In yet another alternative, the PCB production apparatus 100 will include the function head 115c of FIG. 6e wherein two separate ink-printing mechanisms 120 may be automatically load and unloaded.

Figure 9D:
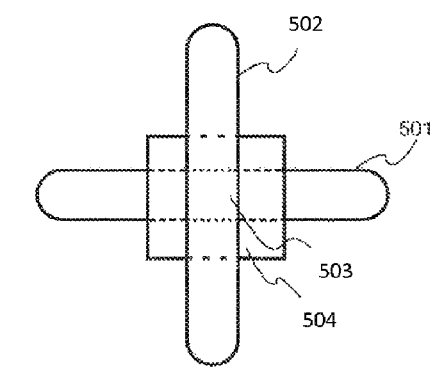
FIG. 9d is a diagram of PCB traces and an insulating patch of the present disclosure.

Referring to FIG. 9d, an embodiment of a process to print a PWB using the PCB production apparatus 100 starts with the first conductive trace operation 221 wherein the function head 115 is controlled to print the first conductive trace 501 on the substrate using conductive ink. Next, operation 222 controls the PCB production apparatus 100 to print insulating patch 504 using a non-conductive ink. Lastly, second conductive trace 502 is printed using a conductive ink in operation 224.

Referring to FIG. 10a, a first conductive trace 210 is representative of a first conductive layer as an output from a CAD tool, Gerber file or image file. The first conductive trace 210 is printed first on a substrate 214. A second conductive trace 211 is representative of a second conductive layer. The first conductive trace 210 and the second conductive trace 211 intersect, or overlap, at a conductive trace intersection 212. The conductive trace intersection 212 is calculated by the LTM 152, or if so configured, an external circuit layout tool. The PCB production apparatus 100 alternates printing of conductive ink for the conductive traces, 210 and 211 and non-conductive inks for the insulating geometry 213.

Creating Layer Connections.

Referring to FIG. 10b, when electrical connection between a portion of first conductive layer 241 and second conductive layer 243 is to be made, typically at a location where a via hole is found using the drill file and/or the Gerber files, an opening 244 in insulating layer 242 is optionally printed by not printing insulating ink in this region as discussed below. In this way, when second conducting layer 243 is printed on top of insulating layer 242, electrical connection is optionally made between first conductive layer 241 and second conductive layer 243.

In printing two-layer and multi-layer PWBs using the PCB production apparatus 100, the need to print conductive connections between conductive traces arises. These connections replace the drilled vias, 60*a* and 60*b*, in a traditional PWB as described above in relation to FIG. 1*c*. In processing PCB files, the LTM 152 optionally creates a list of locations where conductive ink would overlap creating an electric connection between conductive traces of two or more conductive layers. CAD tools for layout of PCB's typically output a data file, referred as a drill file or Excellon drill file, that includes the two dimensional locations of holes that are used by the PCB manufacturer to create plated-through via holes. As shown in FIG. 1*c*, these vias are used to connect circuit features between multiple layers in a multilayer PCB. The LTM 152 optionally uses the data stored in the drill file to aid in the location of circuit connections where conductive ink is placed by the PCB production apparatus 100.

Typically optionally used by traditional PCB vendors, drilled via holes are often located at a center of a circular pad similar to the pads 72 of FIG. 1*c*. The individual pad information is contained in the PCB file for each conductive layer. For example, in the text file for Gerber extended 274X, a 0.1 inch diameter pad would be described using the following statements:

% ADD10C,0.1*%
X0Y0D2*D10*G1X58333Y155833D3*X0Y0D2*M02*.

For the first statement, AD is an aperture description, D10 is a circular aperture, C is a circle macro, 0.1 is a diameter of 0.1 inches. The second line lists a center of the pad at x=0.5833 inches and y=1.55833 inches. The information contained in this Gerber file is optionally compared to a second Gerber file and is optionally used to determine if two pads overlap and therefore should be connected in the final circuit without the need to examine the drill file. In addition, as drilled via holes are no longer required when printing conductive ink on a substrate using the PCB production apparatus 100, pad features are optionally eliminated or at least their diameters are optionally reduced during the layout process or after the layout process.

Figure 12A:
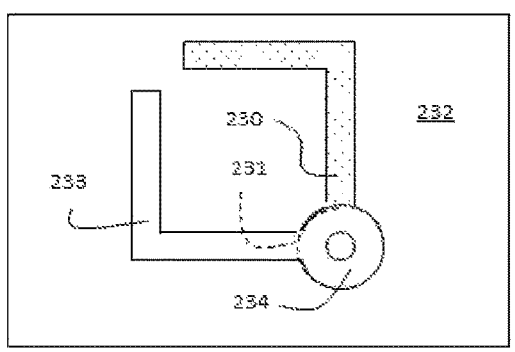
FIG. 12a is a plan view of a PCB including a trace connection of the present disclosure.
Figure 12B:
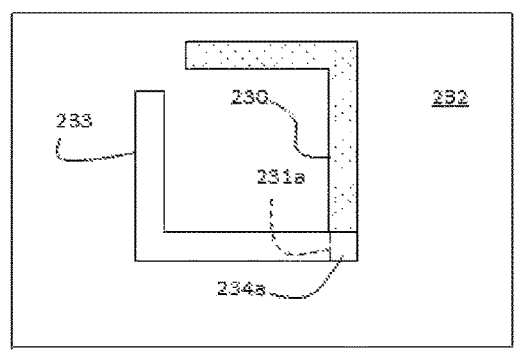
FIG. 12b is a plan view of a PCB including another trace connection of the present disclosure.

Referring to FIGS. 12*a* and 12*b*, a first conductive trace 230 which is included in a PCB file for one layer of a multilayered PWB is printed onto substrate 232. First conductive trace 230 includes a first conductive pad 231 (portion of outline shown in dashes). A second conductive trace 233 is from another PCB file for another conductive layer of the multilayered PWB. The second conductive trace 233 includes a second conductive pad 234. When examining the PCB files associated with these conductive layouts or when examining an electrical schematic for the intended circuit, or when examining the drill file, the LTM 152 first determines that the first conductive pad 231 is to make electrical contact to the second conductive pad 234, then the second conductive pad 234 is printed directly on top of the first conductive pad 231 as represented by the partial dashed outline of the first conductive pad 231.

Another method optionally effected by the LTM 152 is to combine the layouts of first conductive trace 230 and first conductive pad 231 and second conductive trace 233 and second conductive pad 234 into a combined conductive trace and print both sets of conductive geometries at the same time in which the layout would not need the conductive pads and a continuous configuration having the outline shown in FIG. 12*b* is produced.

In traditional multilayer PWB, a via hole is drilled through the entire stackup of conductive layers and substrates. To ensure the plating process adheres within the drilled hole, conductive circular pads are typically located on each conductive layer for each plated through hole to be drilled through thus allowing tolerance for the drilling alignment. In some traditional PWB applications, the via hole is only drilled through the layers that require direct electrical connection(s). These types of vias are called "blind-hole vias" and are typically more expensive to manufacture using traditional methods. Using the PCB production apparatus 100, printing the equivalent of a blind-hole via is easily created by only printing the electrical connection between those conductive traces. Using the PCB production apparatus 100, printing the equivalent of a blind-via would not add any additional cost to the printed PWB and is advantageous as it will reduce an amount of conductive ink that is to be printed by eliminating the typical circular pads, 231 and 234, from those layers that would have been used in a standard chemically etched PCB process. Instead, a configuration, as shown in FIG. 12*b*, results wherein the ends of the conductive traces, 231*a* and 234*a*, overlap to make a connection when the conductive traces, 230 and 233, cannot be printed in the same operation because of other overlapping contingencies which require the insulating geometry 213 of FIG. 10*a*.

Figure 13:
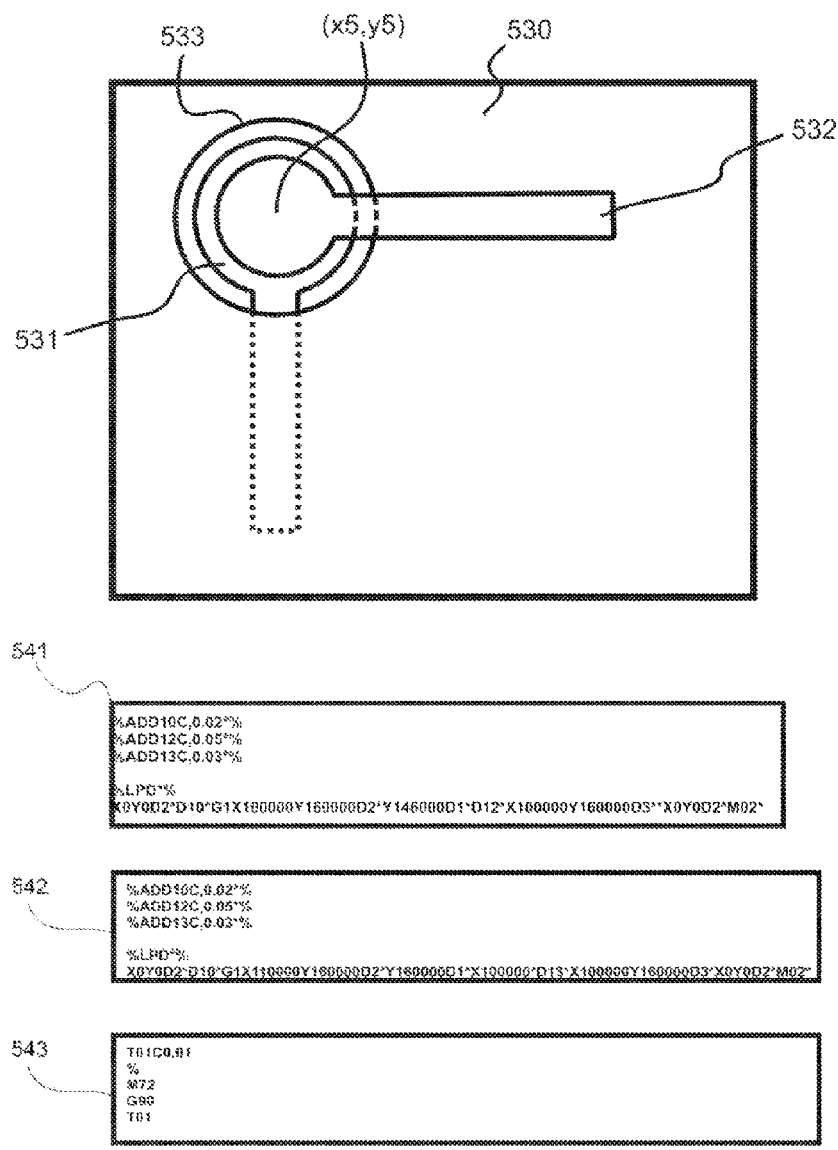
FIG. 13 is a plan view of a PCB including another trace connection of the present disclosure, and PCB file syntax for effecting PCB fabrication of circuit traces.

Software layout tools that generate Gerber files will also generate a drill file that contains information regarding plated-through-hole via connections between layers. Apparatus may use information in the drill file to determine the (x,y) locations where electrical connections are to be made and also where to create clearance holes in a non-conductive layer to allow these connections. Referring to FIG. 13, first conductive trace 531 is to connect to second conductive trace 532. The layout information of first conductive trace 531 is contained in a first Gerber file 541. The layout information for second conductive trace 532 is contained in second Gerber file 542. The via hole information, including center location (x5,y5), is contained in Drill File 543.

When printing conductive and non-conductive inks in order to connect first conductive trace 531 to second conductive trace 532 only on the area of via hole center (x5,y5), the process begins by identifying the (x5,y5) location of via hole using the drill file associated with the PWB. The second operation is to print first conductive trace 531.

The third operation in the process is to print insulating patch 530. Insulating patch 530 includes first clearance hole 533 which exposes a portion of first conductive trace 531 in the area of via hole center (x5,y5). Insulating patch 530 is optionally designed to cover all other conductive traces associated with the layer containing first conductive trace 531 or only a portion of other conductive traces associated with the layer containing first conductive traces. Alternatively, insulating patch 530 may contain other clearance holes associated with other connections between two conductive layers. Alternatively, insulating patch 530 can completely cover the substrate and all remaining conductive traces associated with the layer containing first conductive trace 531 with the exception of first clearance hole 533 which exposes a portion of first conductive trace 531 and any other clearance holes used to connect two layers.

The fourth operation in the process is to print second conductive trace 532 on top of insulating patch 530. As second conductive trace 532 overlaps first conductive trace 531 in the area of (x5, y5), there will be an electrical connection between first conductive trace 531 and second conductive trace 532. The diameter of first clearance hole 533 is optionally set to a nominal value determined automatically or entered by the user. Alternatively, the diameter of first clearance hole 533 is optionally determined using pad diameter information contained in Gerber file 541 and/or Gerber file 542. In one case, the diameter of first clearance hole 533 will be set to the largest diameter of pad connected to first conductive trace 531 or second conductive trace 532. In another case, the diameter of first clearance hole 533 will be set to a diameter larger than the largest pad connected to first conductive trace 531 or second conductive trace 532. In this case, the diameter of first clearance hole 533 is optionally oversized to take up printing tolerances while still exposing the conductive ink associated with first conductive trace 531 and second conductive trace 532. Typically oversize diameters will be 10 mils larger than the largest pad connected to first conductive trace 531 or second conductive trace 532.

In an alternative embodiment of the PCB production apparatus 100, the LTM 152 of FIG. 7 is included within a CAD tool that produces the insulating patch with the required clearance hole. The CAD tool will output the geometry of the insulating patch as a data file including Gerber.

Ink Conservation.

To conserve ink, the GERBER file information may be used to create a framework of the original circuit trace. In this case, the translation software may find the center line or an edge line to print the conductive ink. By examining the GERBER file, the start and end points of a conductive line are optionally determined and the printed line width is optionally optimized to reduce the overall cost of the printed circuit.

Figure 14A:
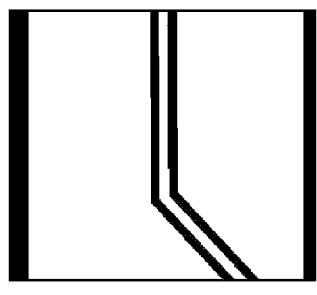
FIG. 14a is a plan view of a PCB including a circuit plane embodiment of the present disclosure.
Figure 14B:
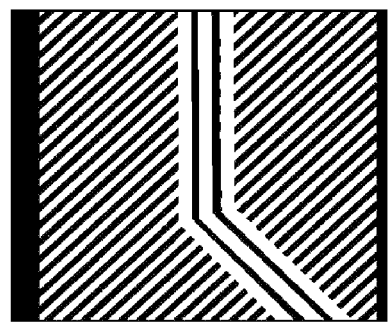
FIG. 14b is a plan view of a PCB including another circuit plane embodiment of the present disclosure.
Figure 14C:
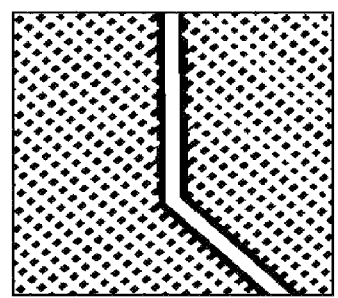
FIG. 14c is a plan view of a PCB including another circuit plane embodiment of the present disclosure.

Another way to conserve ink it to create a mesh in areas that were originally specified as solid conductive regions. For example FIG. 14*a* shows a original GERBER file having two large areas of solid conductor on either side of the conductive line. When using a chemically etched or mechanically machined printed wiring board, it is relatively easy to leave these large conductive areas in place as the original printed wiring boards are completely clad in copper. When printing conductive inks onto a substrate, it is faster and more economical to reduce the amount of ink printed onto the substrate. In this case, the LTM 152 will identify these large conductive regions and create a mesh that will be printed as a substitute. FIGS. 14*b* and 14*c* show two mesh equivalents that will be printed with conductive ink. It is important to note the configurations shown in FIGS. 14*b* and 14*c*, are not the only possible mesh configurations as there are numerous configurations that will provide the electrical equivalent to a solid conductor.

In an alternative embodiment of the PCB production apparatus 100, the LTM 152 of FIG. 7 is included within a CAD tool that produces the mesh. The CAD tool will output the geometry of the mesh as a data file including Gerber.

Printing Order.

Figure 15:
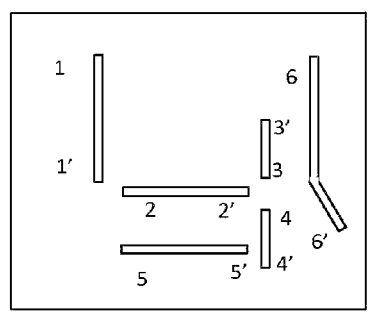
FIG. 15 is a plan view of a PCB having conductive traces thereon.

When printing inks, the function head 115 including the ink-printing mechanism 120 must move around the substrate under the control of the apparatus firmware. The LTM 152 analyzes the PCB file to create a configuration which is effective to move the function head with the minimum travel path. For example, FIG. 15 shows a typical circuit layout have 6 individual lines that need to be printed. The original PCB file may include the physical locations for endpoints of these lines but may not have listed the lines in an optimized order for printing using the ink-printing mechanism 120. The LTM 152 re-orders the lines to increase printing speed and decrease the total travel path for two or more lines. In one optional configuration, the LTM 152 will group endpoints with the nearest proximity. For example, FIG. 15 shows the six lines with endpoints labeled. For example, line 1 has endpoints 1 and F. The LTM 152 groups 1' and 2 as being physically near each other. This group may also include endpoint 5. Another grouping may include endpoints 2', 3 and 4. Another group may include 4' and 5'. Movement of the ink-printing mechanism 120 will be controlled by an optimized ordering of the endpoints. For example, assume that the last position of the ink-printing 120 is near endpoint 1. One solution is to begin by printing line 1-1', then 2-2', then 3-3', then 4-4' then 5'-5. The LTM 152 optionally uses the length and angle of the individual lines to minimize the total path traveled. The LTM 152 optionally optimizes the traveled path with relation to acceleration of the ink-printing mechanism 120 that is optionally used. The optimized travel path is not limited to the ones discussed here as there are other algorithm that is optionally used to optimize the travel path. For example, the optimization may include the starting point or "home" location of the ink-printing mechanism 120. A similar optimization process may be used for the epoxy-printing mechanism 130, pick-and-place mechanism 140 and protective-ink mechanism 120. A different ordering and path optimization is optionally used for each mechanism, 120, 130, or 140. For example, the pick-and-place mechanism 140 requires that the mechanism 140 moves to a known location to pick up the components to be placed. In this case, the optimized travel path may be different than the other mechanisms as the mechanism 140 will need to be returned to the component feed mechanism 122 for picking up the individual components.

Component Placement Order.

In the PCB production apparatus 100 that optionally includes a pick and place function, the function head 115 would include the pick-and-place mechanism 140. In one configuration, the pick-and-place mechanism 140 includes a vacuum pickup, vacuum tip, and/or suction cup, for temporarily holding an electrical component while the component is positioned onto the substrate. The pick-and-place mechanism 140, either in part or whole, may be detachable from the function head 115 in order to share common components with the ink-printing mechanism(s) 120. In the preferred configuration, the pick-and-place mechanism 140 is located adjacent to the printing mechanism(s). The function head 115 optionally has a rotation motor 116 to rotate the pick-and-place mechanism 140 or the pick-and-place mechanism 140 includes the rotation motor 116 to implement a rotation feature to properly position the electrical component onto the substrate 105. The minimum rotation capability would be 0-degrees and 90-degrees but other rotation angles may be possible. In one embodiment, or the function head 115 has the rotation motor 116 arranged to rotate the electrical component prior to placement on the substrate. Another embodiment has the rotation motor 116 arranged to rotate the entire function head 115*a*.

The function head 115*b* optionally includes a motor, a solenoid, field coil or other controllable actuator, or multiples thereof, set a distance between a selected one of the mechanisms 120, 130, or 140, and the table 104. For example, a solenoid may be used to lower a height of the ink-printing-mechanism 120 such that the insulator-printing mechanism 120', pick-and-place mechanism 140 and epoxy-printing mechanism 130, will maintain a larger distance to the surface of the table 104.

Heater.

The printing table 104 optionally includes the heater 118 embodied as a heating element to elevate the temperature of the substrate 105 in order to accelerate curing of inks and epoxies. For example, the Novacentrix HPS-021LV has a cure time of 30 minutes when the ink is held at 125 degrees-C. The apparatus-firmware would control the heating element in the printing table. The temperature control optionally employs a temperature sensor 118s which is monitored by the controller 95 for effecting correct curing of epoxies and inks Ink-Flow Sensor.

An ink-flow sensor 119 is optionally used to measure when the ink has begun to flow and has reached the substrate. The sensor 119 is optionally optically-based or measurement based. In an embodiment, a measurement based sensor 119 measures a resistance and/or capacitance between an ink dispensing tip and the substrate 105. For example, the dispensing tip is optionally metallic and with a sensor connected between the tip and the substrate, a relative change in the resistance and/or capacitance is measured with and without ink flowing between the tip and the substrate.

Component Placement.

The pick-and-place mechanism 140 is optionally integrated in the PCB production apparatus 100 and operates in conjunction with a component feed mechanism 122. Referring to FIG. 4, the component feed system optionally includes a "tape and reel" strip mechanism 122a. The strips often contain a set of equally-spaced holes along the side of the tape for locating the components and pulling, or pushing, the tape into the apparatus.

Referring to FIGS. 16a-16h, an alternate configuration for the component feed mechanism 122 is a tray system 122b wherein electrical components are held in a component tray and components are manually loaded into a tray or slot and the components are picked up by the pick-and-place mechanism 140 for placement onto the substrate 105. When using a tray system, the components are optionally ejected or dropped from a hole or slot located at the bottom or side of the tray. The hole or slot location is pre-determined so the pick-and-place mechanism 140 has knowledge of the component location for picking up the component. The tray system 122b may include individual trays containing a cavity or hole that is sized to the electrical component. The individual trays have an outer dimension that is common.

Figure 16A:
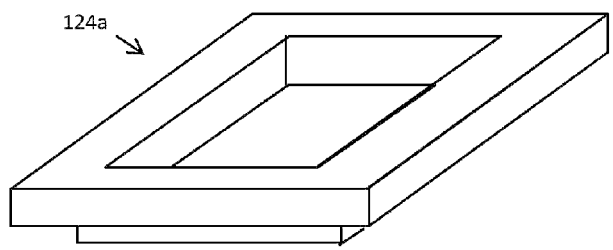
FIG. 16a is perspective view of a component tray of the present disclosure.

Referring to FIG. 16a, an example of a component tray 124a is shown. The tray material is optionally plastic, metal or any other suitable material that can support holding the component in place. It is expected that the tray has a bottom for holding the components. The bottom could be closed or have an opening that could aid in locating the tray within the apparatus. The depth of the component tray 124a is approximately equal to the height of the component. This would allow the top of all the components to be located at approximately the same position when placed within the apparatus making it easier for the pick-and-place mechanism 140 to pick up the component. The top hole opening in the component tray 124a would correspond to the size of the component. The individual component trays 124a would be inserted into the apparatus along a tray support frame 125 as shown in FIGS. 16b-16d. The spacing between rails of the tray support frame 125 is approximately equal to the tray width. A lip or edge may be included as part of the tray support to properly position the tray along the center of the tray support frame 125. The centers of the trays 124a will be known to the apparatus so that the pick-and-place mechanism 140 can pick up a component. The tray or trays 124a may be fed into the apparatus as part of the feed-mechanism.

In another configuration, a tray or trays 124a have a location that is fixed once the trays are inserted into the apparatus. In another configuration, a tray 124a may be ejected from the component feed mechanism 122 once the component is removed from the tray 124a. In this configuration a next tray 124a is optionally moved into the location of the tray 124a that was previously ejected. This configuration allows the pick-and-place mechanism 140 the option to pick up components in the same location. FIG. 16d shows a configuration for trays 124b which include a key arrangement. The key is an interlocking mechanism for aligning the trays 124b along the tray support 125. The trays, 124a or 124b, are optionally interconnected prior to placement into the apparatus.

Referring to FIGS. 16e and 16f, in an alternative configuration may have the trays be assembled as one part as a multi-cavity tray, 124c and 124d. This allows the components of a specific circuit to be pre-assembled and inserted as one common unit into the component feed mechanism 122. The trays are optionally held in place with a spring loaded mechanism similar to a desk stapler wherein a spring loaded mechanism pushes the trays to the front of the component feed mechanism 122, for example, a front of the tray support frame.

Referring to FIG. 16e, the multi-cavity tray 124c includes several elevated walls creating separate compartments to place individual components or groups of components. The example of the multi-cavity tray 124c shown has three compartments but may include more or fewer compartments. The compartments may be of equal size or are optionally sized to accommodate the variety of different package sizes of modern electronic components including resistors, capacitors, diodes, transistors and integrated circuits to name a few. FIG. 16f shows a multi-cavity tray 124d wherein heights are made unequal to accommodate differences in heights of various parts. For example, the height of a 0603 surface mount resistor would be 0.45 mm and the height of a 1206 resistor would be 0.6 mm. The compartment height may be optimized for manual insertion of the components by sizing the heights to fit the component height relative to the operator's finger sliding the part into the compartment. In one example, it may be easier to slide the component into a corner when the compartment height is slightly lower than a top surface of the multi-cavity tray, 124c or 124d.

In contrast to tray 124a, the multi-cavity tray, 124c or 124d, optionally has one or more sides open to aid the operator in placing the parts into the multi-cavity trays, 124c or 124d, which are shown as having one open side for exemplary purposes and are not so limited. The operator may manually place a part into the multi-cavity trays, 124c or 124d, and slide the component into a corner of the multi-cavity trays, 124c or 124d. Based on a location of a corner of tray 124a, or if more than one compartment, corners of the tray, 124c or 124d, the CMCM 127 is able to position the pick-and-place mechanism 140 near an appropriate corner in order to pick up the component. The operator may enter a location of each component into a table displayed on a computer screen or other visual interface device. The preferred location of the component on the tray is optionally determined by the CMCM 127. In this case, the CMCM 127 will display one or more of component identification, the associated compartment location, component orientation, and compartment corner for positioning the component. When guided by CMCM 127, there may be an ideal tray location for each part which improves the speed of the pick-and-place operation. For example, if the printed circuit includes a resistor located in the bottom region of the circuit and a capacitor in the upper region of the circuit, the ideal location for the resistor would be at the lower portion of the tray and the capacitor at the upper region of the tray.

In this way, the movement of the pick-and-place mechanism 140 is controlled to reduce a total length of movement.

Referring to FIG. 16*f*, a tray 124*e* may also include a guide that allows a more accurate alignment of the component as it is pushed into the compartment. An example of the tray 124*e* is shown and has a channelized compartment that becomes narrower near the top. If a component is placed into the compartment at the bottom and then pushed up, either by a finger or other automated device, as the part moves up into the compartment, the component will be properly positioned at the top of the compartment. It is noted that an actual orientation of the tray 124*e* is in the horizontal plane, the discussion of compartment and tray configuration is relative to the figures of this document. It is understood that components come in a variety of sizes and shapes so it is expected that this channelized approach would not be able to accommodate all components. In this case, more than one channel is provided for the tray system.

In most integrated circuits having multiple pins, the package includes a marked feature to highlight the location of one of the pins, typically pin 1. FIG. 16*h* shows a typical package of an integrated circuit having 14 pins. Pin 1 is clearly marked with the "dot" located near pin designated as pin 1 for this package. Referring to FIG. 16*i*, an embodiment of a tray 124*f* includes a mark that indicates how the component should be loaded into the tray. For example and not limitation, the tray 124*f* includes a "dot" to be used to properly locate the associated "dot" on the package of the integrated circuit. The operator is optionally guided by the CMCM 127 as to how the component should be positioned in the tray. This is optionally provided by the aid of a graphical image or a text based description of the component location on the display.

For components with two terminals, such as diodes, the "dot" convention is typically not used. In this case, components manufacturers rely on a variety of different marking schemes to describe the direction of current flow from anode to cathode. When placing this type of device onto a tray, an identifiable mark is optionally placed on the tray to aid the operator as to the proper orientation for the component. One such mark is optionally a typical schematic symbol for a diode. The CMCM 127 may also provide a graphical image or text based description of the proper orientation for the component when placed in the tray.

To eliminate the need for accurately placing a component into a tray for pickup by the pick-and-place mechanism 140, or when improved accuracy is needed when placing a component onto a substrate, optionally provided is the imaging device 108, such as a camera, for providing the CMCM 127 with a method to "visually" identify a components orientation and offset in order to rotate the component prior to placement onto the substrate 105 or to offset the component when placing the component on the substrate 105. The imaging device 108 is optionally located above, below or to the side of the component in the tray. The imaging device 108 is optionally located separate from the tray and the pick-and-place mechanism 140 will pick up the component from the tray and then move the component into the visual field of the imaging device 108. In this case, the imaging device 108 is optionally located above, below or to the side of the component as the pick-and-place mechanism 140 moves the component into the field of view of the imaging device 108.

An embodiment of PCB production apparatus 100 has a camera system as the imaging device 108 placed adjacent to the tray pointing upward. The pick-and-place mechanism 140 picks up the component from the tray and move the component over a camera lens. The camera image is passed to an algorithm to detect edges and/or a center of the component. Any rotation of the component relative to a desired position on the substrate 105 is corrected to within a given tolerance by the PCB production apparatus 100 prior to placement on the substrate 105. The pick-and-place mechanism 140 is optionally capable of rotating the component as discussed herein with regard to the rotation motor 116. In an advantageous embodiment, the pick-and-place mechanism 140 can rotate the part by at least 90 degrees. More preferably the pick-and-place mechanism 140 can rotate the part by at least 180 degrees. Even more preferably the pick-and-place mechanism 140 can rotate the component over a 360 degree angle. The camera is optionally any relatively low cost camera such as the LinkSprite JPEG 2MP Color Camera. As most cameras have a long focal point, a macro lens is optionally placed over the lens of the camera system in order to be able to focus the camera on the component which can be fairly close to the imaging system.

In another embodiment of the present disclosure, the operator manually places components onto the tray and then the pick-and-place mechanism 140 picks up the components and moves them to a separate location or "holding area" for temporary storage until they can be placed on the substrate 105 at a later time. One benefit to this action is that the operator may place all the necessary components into the apparatus during one step in the total print and assembly process. For example, by placing all the components into the PCB production apparatus 100 during the initial phase of the operation, all printing and component assembly can occur without any further intervention by the operator. Another benefit for the implementation of a holding area is to reduce the complexity of the tray system which optionally allows for a tray with a single compartment. Another benefit to the holding location is that a tape-and-reel system is optionally added to PCB production apparatus 100 where the tape and reel system only requires a single reel handling mechanism.

For the pick-and-place mechanism 140, the LTM 152 may also create a list of an order for which the components would be placed onto the substrate. The list may be provided to the user prior to inserting the components into the PCB production apparatus 100. In this way the components may be inserted in the optimized order for facilitating the pick and place process. As another option would allow the user to enter a list of components in an order in which the user inserted the components into the PCB production apparatus 100. The component mounting control module (CMCM) 127, implemented by the controller 95 and shown in FIG. 7, uses this list and the information provided by the LTM 152 to pick up the components. The CMCM 127, based on the location and order of the components loaded into the apparatus, optionally optimizes an order in which to pick up the components to improve throughput of the pick-and-place process. Another option is to provide an electronic file that contains an order of the components based on a pre-determined order. For example, if the components are assembled into a tray or other holding mechanism, the order of the components in the tray is optionally contained in a electronic file which is optionally used by the CMCM 127. The optimization algorithm of the pick-and-place process is optionally embodied in the LTM 152 or the CMCM 127.

One Layer Component Positioning.

In a standard PCB process using two or more conductive layers, it is possible to place and solder components to the outermost two layers on the PWB. As there is at least one insulating layer between these conductive layers, components are placed at or near the same (x,y) coordinates so there could be a some amount of overlap between the components without interfering with each other. When using PCB production apparatus 100, all components are placed on one layer of the substrate. For PCB production apparatus 100, the components are on one side and must be properly positioned so there is not overlap between the components and their respective pads.

Figure 21:
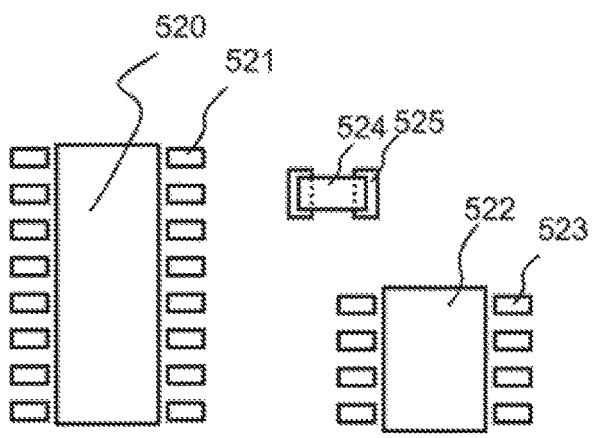
FIG. 21 is an illustration of standard component pad arrangements.

Referring to FIG. 21, first component 520 having at least one first connection pad 521 and second component 522 having at least one second connection pad 523 and third component 524 having at least one third connection pad 525 are positioned so there is no overlap between components and pads. Not shown in FIG. 21 are leads coming from first component 520 and second component 522 that lay on top of the pads. In one method embodiment, the LTM 152 locates the connection pads of all components on the conductor layer that is printed directly on the substrate as this will guarantee the component leads will have a flat and uniform surface during the pick-and-place operation of PCB production apparatus 100. The LTM 152 functions to avoid other conductive traces and insulating layers interfering with properly positioning the component leads on the connection pads during the pick-and-place operation.

In an embodiment of the LTM 152, conductive traces are positioned to run under the components and these conductive traces will be printed on the same conductive layer as the connection pads. In cases where it is expected that the PWB will exposed to the environment, the LTM 152 will automatically create a PCB file, for example and not limitation, a Gerber file, that will include a non-conductive pad to completely cover the conductive line that is printed under the component so that the conductive line will not oxidize when exposed to the environment. The components and associated connection pads are spaced far enough apart so there is no overlap while also providing space for connecting conductive traces. For example, spacing connection pads by at least 30 mils will allow at least one conductive trace to be routed between two components assuming that a printed conductive trace has a minimum width of 10 mils and the spacing between conductive elements is a minimum of 10 mils on either side of a conductive line. The LTM 152 follows guidelines set for component spacing which may include using a default or user-generated value for the component spacing.

In an alternative embodiment of the PCB production apparatus 100, the LTM 152 of FIG. 7 is included within a CAD tool that produces the layout with the required spacing for the conductive traces and pads. The CAD tool will output the geometry of the conductive layer as a data file including Gerber.

Extruder.

PCB production apparatus 100 optionally includes a plastic-extruder 123 for printing a plastic housing over the substrate. In one configuration, the plastic-extruder 123 is part of the function head 115. The plastic-extruder 123 is similar to 3-D printers available on the commercial market. The plastic-extruder 123 is optionally used to fabricate the substrate on which the conductive traces and components are placed. Printing the substrate allows for a variety of complex three dimensional shapes to be fabricated and also provides a more accurate placement of the components and printing the conductive and non-conductive traces as the same apparatus head is used for all types of material printing.

The outer surface of a complex three dimensional shape or form can be modeled and included as part of the printing and assembly process. The surface model would be used to position the ink-printing mechanism over the substrate. The surface model can be an electronic file that is used by the LTM for the printing and assembly process. The PCB production apparatus 100 may include an integrated surface scanner or digitizer, referred here as the surface-scanner, used to measure the three dimensional substrate and/or three dimensional substrate-form in order to create a model of the surface contour for any three dimensional object.

Protective Coating.

PCB production apparatus 100 may also have a mechanism for printing a protective coating over the surface of the circuit. In some applications, it may be important to protect the surface from scratches. In this case, a protective-ink mechanism 120 is included in PCB production apparatus 100, and may be part of the function head 115. Some protective coatings, such as the commercially available "Humiseal", can provide a conformal coating and shield against moisture, humidity and chemicals. These coating materials may be of type acrylic, polyurethane, silicone to name a few.

Camera.

PCB production apparatus 100 optionally includes the imaging device 108 embodied as a camera for identifying to orientation of components used during the pick-and-place process. For example, there may be a slight rotation of the parts in the component holder and when the pick-and-place mechanism 140 picks up the component, the camera is optionally used by the CMCM 127 to identify if the component is properly positioned for placement onto the substrate.

Conductive Substrate.

In addition to non-conductive substrates, the substrate material is optionally electrically conductive, semiconductive or metallic. When using these types of conductive or partially conductive substrates, the PCM 128 would first print a layer of insulating ink prior to printing the electrically conductive circuit traces using conductive ink. Substrates that are metallic and electrically conductive are optionally used to improve the thermal dissipation of high power electrical components and assemblies such as high power transistors and light emitting diode (LEDs). Printing a thin insulating layer between the electrically conductive circuit traces and the substrate may substantially improve the thermal performance of the circuit where excessive heat generated by the electrical components is transmitted through the thin layer of insulating material to the metallic substrate and dissipated away from the components. The technique of printing a thin layer of insulation ink over a metallic substrate would also be useful in applications that do not require high thermal dissipation but optionally uses a high strength substrate.

Substrate Positioning.

As discussed above, the PCB production apparatus 100 optionally includes a substrate-positioning/holding mechanism (SPHM) 121 to aid the operator in properly positioning the substrate 105 onto the printing table. The SPHM 121 may be a simple cross hair or grid located across the surface of the printing table. The SPHM 121 may be a raised edge or a combination of raised edges in which the operator can push the substrate 105 into the proper location known to the PCB production apparatus 100. The SPHM 121 may be useful to identify a common point for the PCB production apparatus 100 to use as an absolute reference to the circuit geometries that will be printed. The SPHM 121 is optionally removable and placed within the PCB production apparatus 100 once the substrate 105 is properly positioned. The SPHM 121 is optionally an optical-based or sensor-based sub-system to automatically locate edges of the substrate 105 once the substrate 105 is placed on the printing table. In this case, the position of the substrate 105 is optionally arbitrary and the PCB production apparatus 100 will automatically locate the substrate 105 on the printing table.

The PCB production apparatus 100 may include the substrate-holding mechanism 121 to temporarily hold the substrate 105 in place during the printing and assembly process. The substrate-holding mechanism 121 is optionally clips, weights or any object capable of temporarily holding the substrate 105 in position. The substrate-holding mechanism 121 may be a vacuum based sub-system which is optionally activated once the substrate 105 is properly positioned onto the printing table.

Substrates are not limited to planar, or flat, geometries. The substrate 105 can also be any three dimensional object which would support the conductive ink and/or associated circuit components. Any complex surface geometry is modeled and included as part of the printing and assembly process. The surface model would be used to position the ink-printing 120 over the substrate 105. PCB production apparatus 100 may include an integrated scanner or digitizer, referred to herein as the surface-scanner as one of the imaging devices 108, which is used to measure the three dimensional substrate 105 and/or three dimensional substrate-form in order to create a model of the surface contour for any three dimensional object.

Conductive Ink Printing Using Channels.

When printing conductive inks using the ink printing mechanism 120 embodied as a syringe, inkjet, piezoelectric or other means of dispensing conductive inks onto a substrate 105, it may be desired to layer the ink in order to build up enough cross section for use in circuit applications requiring high electrical current. In order to constrain conductive traces to a narrow width while providing a thickness to the total cross section of the printed conductive line, an initial printing process using non-conductive inks provide support during the layering of the conductive ink. Referring to FIG. 17*a*, the support process begins with the PCM 128 printing non-conductive material 135 on one (not shown) or both sides of a conductive circuit line 136 which is next printed. The non-conductive material 135 creates a channel for conductive ink 136. Referring to FIG. 17*b*, printing non-conductive material 135 is useful when two conductive lines 136 are in close proximity and the non-conductive material 135 prevents an electrical connection, or "bridge", from occurring between the two conductive lines 136. The process for FIG. 17*b* implemented by the PCM 128 optionally starts with printing one conductive line 136, then the non-conductive material 135, then the second conductive line 136. The process in FIG. 17*a* could also start with printing the non-conductive material 135 first, and then by printing the two conductive lines 136.

Conductive Ink Printing without Drying the Print Surface.

When printing conductive inks using techniques such as syringe printing, inkjet printing, piezoelectric printing and others, it is important that the ink is not allowed to dry at or near the interface where the ink leaves the printing mechanism and the air. Often, a printing process pf the PCM 128 moves enough material to prevent clogging of the printing mechanism 120 or epoxy printing mechanism 130 but in applications where the printing mechanisms, 120 or 130, must move across a large distance, it is possible that the ink may dry at the air interface. One way to prevent drying would be to temporarily cover or cap the printing mechanism, 120 or 130 until the mechanism is at or near the desired printing site. Another technique would be to have a wiping mechanism that wipes a surface of the printing mechanism, 120 or 130, and removes dried ink from the printing mechanism, 120 or 130. The wiping action could include a moist surface to wet the dried ink enough to become fluid. It is known that many conductive inks, including silver nanoparticle inks, are water based. In this case wiping the printing mechanism, 120 or 130, with a damp sponge, cloth or other material prevents the printing mechanism, 120 or 130, from becoming permanently clogged. Thus, an embodiment of the PCB production apparatus 100 optionally has a clog prevention device 138 including one, or both, of a wiping mechanism or capping mechanism, which is controlled by the PCM 128.

Another embodiment of a method optionally employed to prevent the printing mechanism 120 from becoming clogged and implemented by the PCM 128 is to reduce the time between printing and not printing. In this case, the conductive traces are optionally printed in a preferred sequence in order to minimize the time when the printing mechanism is not printing. In a typical application, the printing mechanism's printing surface may have a dimension less than the circuit line dimension thus requiring the printing mechanism 120 to make several passes over the circuit in order to complete the circuit. For example, FIG. 18*a* shows a circuit with two lines having vertical and horizontal sections of lines. The left line has end points EP1 and EP2. The right line has end points EP3 and EP4. For this example, assume that the printing mechanism 120 is an inkjet cartridge with a set of holes arranged in a linear column. The holes eject droplets of ink under the control of the PCM 128. FIG. 18*a* shows an example of the set of holes labeled 5. There are numerous options for printing the lines including printing across the horizontal or printing in the vertical. FIG. 18*b* shows an example of horizontal printing where the printing mechanism 120 is moved horizontally across the substrate 105 and prints ink only where conductive traces are desired. In this case, the shaded areas near end points EP1 and EP3 show the ink deposited from the first pass of the printing mechanism 120 across the substrate 105. In this example, the printing mechanism 120 is moving from left to right, a top portion of line EP1-EP2 would be printed first and as the printing mechanism continues along the horizontal path, the top portion of line EP3-EP4 would be printed next. To continue the printing process, the printing mechanism would be moved down the line and the process would repeat either moving the printing mechanism from right to left, reversing the printing direction, or returning the printing mechanism 120 to the left side and repeating the printing process as before.

If the horizontal spacing between the upper ends of lines EP1-EP2 and EP4-EP4 are too far enough apart, it may be possible that the ink would dry on the surface of the printing mechanism 120 creating a condition of clogging the holes in the printing. It would then be difficult to print the top of line EP3-EP4. In this case it may be optionally used to wipe the surface of the printing mechanism 120 prior to printing line EP3-EP4 or cover the printing mechanism 120 between the printing of line EP1-EP2 and line EP3-EP4 using the clog prevention device 138.

An embodiment of a method of printing directed to address ink drying examines the circuit and prints the circuit in a path that minimizes dead time between activating the printing mechanism 120. For example, FIG. 18*c* shows a shaded area of completely printing line EP1-EP2 before moving to line EP3-EP4. In this case, the spacing between end points EP2 and EP4 is much closer in distance than the spacing between end points EP1and EP3 which would result in a less likely chance that ink on a surface of the printing mechanism 120 dries and clogs the printing mechanism 120. Optimal line spacing is very dependent on a speed of the printing mechanism 120 as it moves across the substrate 105. This spacing is dependent on an amount of ink that is ejected from the printing mechanism 120. This line spacing is dependent on the time it takes for the ink to dry at the printing mechanism 120. In a typical application using a commercially available C6602A inkjet printer cartridge filled with a silver conductive nanoparticle ink, it was determined that the distance between circuit features should be less than 0.25 inches. However, depending on the ink type and temperature, this distance is nominally in the range of 1.0 to .2 inches.

If the holes in the inkjet cartridge are spaced such that the deposited ink from one hole does not make contact to the deposited ink from an adjacent hole, one solution is an overlap process to offset the printing mechanism 120 equal to a distance less than a diameter of the hole in order to overlap the deposited ink between passes of the printing mechanism 120. This overlap process is optionally used in printing conductive ink, non-conductive ink and protective coatings. The overlap process is optionally used for printing processes requiring the deposition of an ink onto a substrate 105 using a syringe, inkjet, piezoelectric, spray or other inking process where the ink leaving a printing mechanism has a smaller dimension than a circuit feature.

Figure 19A:
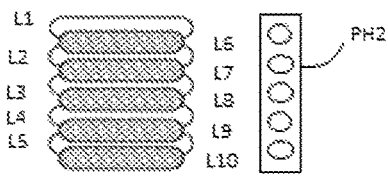
FIG. 19a is an illustration of circuit traces in relation to an embodiment of a print head.

Referring to FIG. 19a, an printed ink pattern using an inkjet cartridge PH2 is illustrated. The unshaded lines L1-L5 depict the first pass of the printing mechanism 120 as it moves from left to right. In this case, the inkjet cartridge PH2 is activated by the PCM 128 as the printing mechanism 120 is moved across the substrate 105 releasing ink onto the substrate 105 producing five thin lines of ink labeled L1-L5. In this example, the inkjet cartridge PH2 includes five separate nozzles which are independently controlled. As the nozzles are spaced a distance apart, there are in this example gaps between the printed lines L1-L5 and gaps between lines L6-L10. The gaps must be filled in order to make connections between adjacent lines. In this process, the printing mechanism 120 is offset by a distance that is less than one diameter of the nozzles of the print head PH2. Lines L6-L10 (stippled) are printed using a second pass of the printing mechanism 120. This process is repeated until a complete circuit feature is produced. This process is optionally used by the PCM 128 for printing conductive traces when the print head PH2 would otherwise leave gaps. This process is optionally used by the PCM 128 for printing non-conductive regions when producing multi layered circuit boards or when a protective coating is optionally used to prevent surface damage to the printed lines or reduce the effects of environmental conditions such as moisture or heat.

Figure 19B:
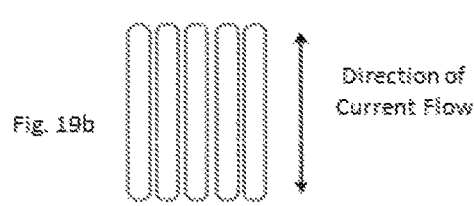
FIG. 19b is an illustration of circuit traces in relation to current flow.

In an one embodiment of the PCM 128, printing conductive traces in the direction of current flow in the final circuit is addressed. Following the discussion of FIG. 19a, the PCM 128 printing direction for lines EP1-EP5 and lines EP6-EP10 is in the direction of the current flow in the final circuit. This process reduces the amount of resistance of the circuit line. This process also improves the performance of high frequency RF circuits. FIG. 19b shows a line printed with a single pass of the printing mechanism having five nozzles in the inkjet cartridge PH2. This line is printed along the direction of current flow. In this example, a second pass of the printing mechanism 120 is optionally used to fill in the gaps left by the nozzles.

To provide the flexibility to print along the direction of current flow, the printing mechanism 120 is rotated by the print head rotation device 129, or the rotation motor 116 rotating the function head 115, in order to align a nozzle plane to be perpendicular to the direction of current by the PCM 128. Alternatively, the printing mechanism 120 remains fixed and the substrate 105 is rotated by the table 104 being rotated by the table rotator 139, shown in FIGS. 4 and 5B, under control of the PCM 128. Rotation of the printing mechanism 120 would not be required in this scenario. Furthermore, using a printing mechanism 120 with a single nozzle, such as in syringe printing or other piezoelectric systems, would obviate the need for gap filling needed in the case of the print head PH2.

Diagonal Lines.

Figure 19C:
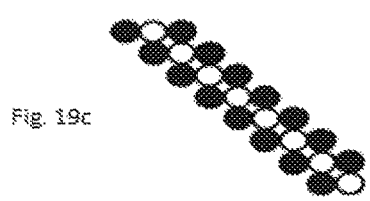
FIG. 19c is an illustration of a diagonal circuit trace.

The PCM 128 controls printing diagonal conductive traces optionally uses a process to ensure that the resistance of the line is below an acceptable level. Printing diagonal conductive traces using any process that ejects ink from a small diameter hole or nozzle, may create limited connections or gaps between the printed dots on the substrate 105. For example, FIG. 19c shows a diagonal line created with a set of printed dots. The unshaded dots are the results of printing a line based on parameters entered by operator or from a conventional PCB file or equivalent database. If the requested line is fairly thin, the dots may not make adequate connection between the adjacent neighbors, as shown by the unshaded dots in FIG. 19c. In this case, the LTM 152 optionally determines that extra dots are required and the PCM 128 prints the dots during the printing process as shown by the shaded dots. Additionally, rotating the printing mechanism 120 or the substrate 105 may lower the resistance when printing diagonal conductive traces as the line may be printed in the direction of the current flow in the final circuit.

Epoxy.

In an embodiment of the present disclosure, component attachment uses deposition of an electrically conductive epoxy or other electrically conductive glue by the PCM 128. Types of conductive epoxy used, for example and not limitation, are MG Chemicals 83315 and Creative Materials 111-29. The printing of epoxy may be performed with a variety techniques including syringe printing, piezoelectric or other types of printing mechanisms. The location for epoxy deposition requires the identification of component pads by the LTM 152. One technique for locating the epoxy deposition is for the LTM 152 to use information contained in a standard PCB file (GERBER file) for a solder mask. The solder mask file provides the location and pad size used when performing a standard soldering operation for the components. This same file is optionally used for the epoxy printing.

Another method for obtaining the location for epoxy deposition may be accomplished by the LTM 152 using information about the components including the size and orientation of the component. For example, if a resistor of size 1206 is placed in a horizontal orientation, the package size and orientation is optionally used to determine the location of the epoxy deposition. This also includes an amount of epoxy optionally used for proper attachment. Additionally, the location for epoxy deposition is optionally determined by the LTM 152 using circuit features contained in the circuit file provided to the LTM 152. For example, conductive traces that end without connection typically require a connection to a component. These features are optionally used by the LTM 152 to produce instructions controlling the PCM 128 during the epoxy deposition process. As some epoxies are rated for a heat cure which often accelerates the curing process, the PCB production apparatus 100 is optionally equipped with a heater in the form of table heater 118. As some epoxies are rated for a UV cure, the PCB production apparatus 100 is optionally equipped with a UV heater 118*a*, shown in FIG. 4. The heaters are optionally controlled by the PCM 128 to automatically operate after deposition of the epoxy.

Solder Paste.

The PCM 128 optionally implements deposition of solder paste by the techniques mentioned above for conductive epoxy. In one embodiment of the PCB production apparatus 100, solder paste is applied by the epoxy dispenser 130 to the printed circuit conductive traces prior to placement of the components. The solder paste would be applied using a syringe, piezoelectric or other printing mechanism. The application of solder paste to the substrate 105 uses either the ink printing mechanism 120 or the epoxy dispenser 130, developed for printing inks and epoxy. In another embodiment of the present disclosure, the PCB production apparatus 100 optionally uses a separate sub-system. As mentioned above, the PCB production apparatus 100 optionally includes an integrated heat source such as the UV heater 118*a* for effecting solder reflow.

It is optionally possible to apply the solder paste using a silk screen process where a solder mask is placed over the substrate 105, which includes the previously printed circuit features, and the solder is pulled across the solder mask to place the solder paste onto the conductive line. This process is fairly standard in the industry but is unique to a system that includes all the printing and attachment processes. The solder paste would be reflowed during a separate heating process of the substrate 105. As mentioned above, the PCB production apparatus 100 optionally includes an integrated heat source such as the UV heater 118*a*.

Non-Conductive Epoxy.

The PCM 128 optionally implements a process for deposition of non-conductive epoxy. For example, when attaching large components or with applications requiring a flexible substrate 105, attachment of components using a non-conductive epoxy aids the component attachment to the substrate 105. In an embodiment of the process, the deposition of non-conductive epoxy is done before the deposition of conductive epoxy or solder paste. Alternately, the non-conductive epoxy is deposited after the deposition of the conductive material. In either case, the deposition of conductive and non-conductive epoxies and/solder onto the substrate 105 occurs prior to the placement of the one or more components onto the substrate 105.

Multilayer Circuit Boards.

When printing a multilayered circuit, the process begins with two or more files containing the individual circuit conductive traces and features. These files are typical of a GERBER format but may be of any PCB file type that properly describes circuit features in each of the layers. In one embodiment of the LTM 152, the files are examined and the locations of the circuit crossovers are determined as discussed above. This identification process may be performed internal to the LTM 152 or external to the PCB production apparatus 100. Once locations of crossovers are identified, the LTM 152 optionally creates a new single layer circuit layout which combines all the circuit conductive traces and features from the layers with the exception of breaks or discontinuities at the location of the crossovers. This process may accelerate the printing process by producing a single layer board that is optionally printed in one pass of the printing mechanism. To produce the completed board, a secondary process of layering non-conductive and conductive layers only in the areas of the crossovers of crossovers is implemented.

In a standard printed wiring board process, each layer is etched onto the surface of a laminated substrate. In this case the crossovers are electrically isolated by the non-conductive substrate material between the various layers. When creating a printed wiring board using a printing process as part of this disclosure, the various layers are compared and crossovers are identified. Once crossovers are identified, different layers are optionally combined into a single layer for printing. In this case, the crossover information is preserved and used during the secondary process.

Figure 20C:
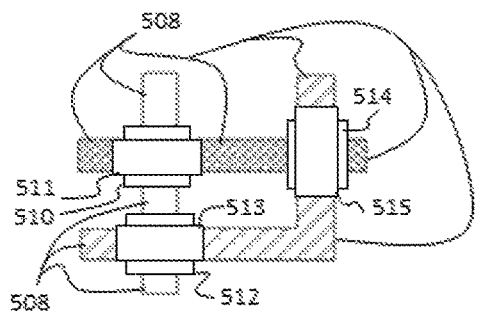
FIG. 20c is an illustration of the circuit traces of FIG. 20b modified by a further method of the present disclosure.
Figure 20D:
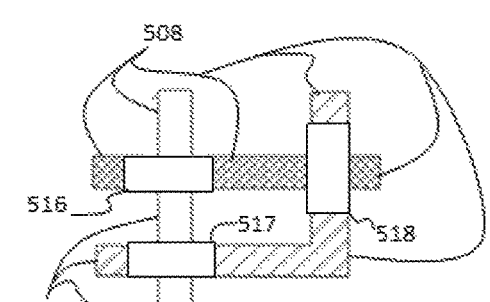
FIG. 20d is an illustration of the circuit traces of FIG. 20b modified by a still further method of the present disclosure.
Figure 20A:
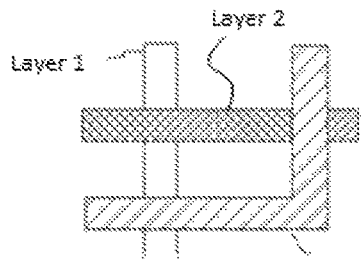
FIG. 20a is an illustration of circuit traces.
Figure 20B:
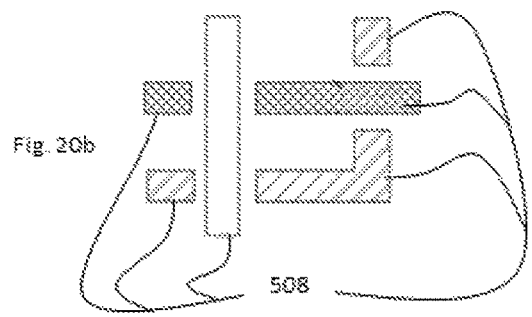
FIG. 20b is an illustration of the circuit traces of FIG. 20a modified by a method of the present disclosure.

Referring to FIGS. 20*a*-20*d*, an example of a layout for a three layer PCB circuit board is shown with each layer being depicted in different shading. For this example, the information for the three layers are optionally contained in three separate files or all contained in one or two files. The process involves the LTM 152 identifying the crossovers and creating a combined single layer equivalent for printing. In this case, FIG. 20*b* shows the combined circuit layout of the combined single layer 508 with three crossovers locations identified. This combined layout includes breaks in the circuit conductive traces where crossovers will be placed in a secondary process after printing the combined single layer 508. For this example, the line on PCB layer 1 is not changed. For this example, the line on PCB layer 2 is produced with break in an area of an intersection between layer 1 but remains continuous in an area of intersection with the line of PCB layer 3. For this example, the line on PCB layer 3 includes two breaks at intersections between the conductive traces in PCB layer 1 and PCB layer 2. The example shown on FIG. 20*b* is only one possible configuration out of many possible combinations for determining which conductive traces are to be implemented with breaks.

The next step is to reconnect the printed conductive traces that have a break. In one embodiment shown in FIG. 20*c*, an area of non-conductive ink 510, 512, or 514 is printed over each one of the conductive traces followed by a layer of conductive ink, embodied in connections 511, 513, or 515, connecting the conductive traces (formerly of layers 1, 2 and 3 of the multilayer PCB) across the breaks in the combined trace layer now printed. In another embodiment shown in FIG. 20*d*, a connecting component, 516, 517, or 518, is optionally glued or soldered across each break. The connection component includes a lower insulating layer and an optional upper conducting layer. In the former embodiment, the connection conductor layer shown in FIG. 20*c* is determined by the LTM 152 and printed by the PCM 128 connecting to the conducting lines of the combined single layer 508 printed on the board as shown in FIG. 20*b*. In the later embodiment, the connecting component, 516, 517, or 518, is optionally a standard commercially available component such as a resistor, capacitor, inductor or wire. In one embodiment, the connecting component is a 0.1 ohm surface mount resistor. In this case, the gap in the break is slightly smaller than the length of the resistor so terminals of the resistor will overlap the desired conductive traces and complete the connection between two segments. In one embodiment, a custom connecting component is optionally used to connect the two conductive traces. In one embodiment, the connecting component is designed with geometry suitable for the pick-and-place mechanism 140. In one case, the connecting component has two electrically conducting terminals for connecting the printed conductive traces to the connecting component. In one embodiment, the connecting component may have a low resistance path between its two terminals. In one embodiment, the connecting component may be an electrical element which provides a means of connecting the two segments of the printed line and also provides an optionally used circuit function such as resistance, capacitance, and inductance.

Printing Resistors Using Conductive Ink.

The process of printing conductive inks is optionally optimized to produce a line with a specified resistance. This technique not only produces an electrical connection between two points but also eliminates need to add a separate resistor to the printed circuit.

Multiple Function Head Registration/Calibration

The function head 115 is optionally used during a calibration process to set to location of an absolute substrate or system position, i.e., table position. This location may be considered the (X, Y, Z)=(0, 0, 0) location or "home" location. Using a common function head 115, the calibration process may only need to be performed once for all inking, deposition, and pick-and-place functions. A Z-axis or vertical calibration is optionally performed periodically before and/or during the printing process or may be performed continuously by means of a sensor which monitors the top of the substrate and printed wiring board. The sensor may include a mechanical "feeler" or by optical means.

Referring to FIGS. 6a-6e, various embodiments of the function head 115 include function heads 115-1 through 115-3 which are directed to specific operations of ink printing, epoxy printing, and component placement. While function head 115-4 combines the aforesaid operation into one function head, use of function heads 115-1 through 115-3 involves interchange of the function heads in the process of producing a PCB. The interchange of function heads may introduce alignment offsets of point of operation of the various heads, the points of operation being where on the substrate ink, epoxy, solder paste or a component is deposited on the substrate 105. Additionally, the function head 115-4 having multiple functions incorporated therein may also require alignment of the points of operation. This may be necessitated by the function head 115-4 accepting replacements of the printing mechanism 120, the epoxy mechanism 130, or the component placement mechanism 140. While precision manufacturing of mechanisms 120, 130, and 140, optimally reduces changes in alignment, an alignment operation is optionally used to compensate for differences in the alignment of function heads.

Predefined built-in offsets for function heads are based on ideal mechanical dimensions of the printing mechanism 120, the epoxy mechanism 130, or the component placement mechanism. For example, the table 104 has an inherent zero position with relation to which operation points of the function heads are to be coordinated. The positioner 90 is optionally zeroed with respect to the inherent zero position such that the motors are operated to position the head mount 110 at a predetermined spatial relationship to the inherent zero position of the table 104. At this position, operating positions in each of the three axes of the positioner 90 are set to zero meaning that, when the controller 95 commands the positioner 95 to move to position 0, 0, 0, for example, it returns to the inherent zero position. This may be done either in the controller 95 as a final adjustment to commands or within the positioner 90.

Each of the function heads has an inherent built-in offset such that when the positioner actually moves the operation point of a given function head to the inherent origin, positions recognized by the positioner 90 and controller 95 will reflect the built-in offsets of the particular function head which will be called for clarity purposes, F1X, F1Y, and F1Z, wherein the designation F1 indicates the particular function head, i.e., function head "F1." When the positioner 90 moves the operation point of the function head to the inherent origin, the controller 95 has directed the positioner to −F1X, −F1Y, and −F1Z. In operation, the controller 95 will make these adjustments in the final commands sent to the positioner 90 and the adjustments will be based on which function head is in use. Optionally, the function heads will include indicia which may be electronically or manually communicated to the controller 95 so that the controller 95 associates the particular function head with stored built-in offsets. This is optionally done by optically reading indicia on the function head using the imaging device 108, or electronically reading the indicia via any of hardwired, RF, such as for example and not limitation, an RFID tag, or infrared.

In practice, the actual built-in offsets will vary based on machining tolerances. If tolerances are wide enough in the particular application to producing a circuit board, use of the built-in offsets may be suffice an no further alignment is necessary. When tolerances are tighter, a calibration is done to effect accurate registration of the function heads with relation to either the substrate or the table.

An embodiment of an alignment method implemented by an alignment module (AM) 142 of the controller 95, shown in FIG. 7, includes operation of the printing mechanism 120 to print a registration mark on the substrate 105 which may be the object of production or may be a test substrate used for alignment. The location on the substrate will have some predefined offsets to the aforesaid zero position of the table which will be called "substrate offsets." The registration mark marks what will be termed a "substrate zero position." The substrate zero position is optionally the inherent origin or a substrate origin defined by substrate origin offsets from the inherent origin. For simplicity purposes in the following discussion, it is taken that the inherent origin and the substrate zero position are the same. It is to be understood that this need not be case and that substrate origin offsets are optionally used to compensate alignment when the inherent origin and the substrate origin are not the same in the following discussion in a manner as will be appreciated by those skilled in the art in light of this disclosure.

Once the registration mark is made by the printing mechanism 120, the epoxy mechanism 130 is next operated to print an epoxy dot at the registration mark made by the ink printing mechanism 120 based on predefined built-in relative offsets between the printing mechanism 120 and the epoxy mechanism 130 and the substrate offsets. However, variations of function head dimensions, and the various mechanism included in the function head, will invariably result in a misalignment of the epoxy dot with the registration mark. In an embodiment of the PCB production apparatus 100, the imaging device 108 is mounted so as to view the registration mark and is read by the alignment module 142 of the controller 95. The X and Y offsets are then determined from the image and stored as head component offsets which are added to the built-in relative offsets of the mechanisms 120, 130, or 140. Alternatively, the offsets may be manually entered and confirmed. In subsequent operations the head component offsets and built-in offsets are used to effect operations.

The component placement mechanism 140 is also calibrated in a similar procedure wherein a standard component or a dummy component is placed by the component placement mechanism 140 so a predefined point of the standard or dummy component is to align with the registration. Head component offsets of the predefined point from the registration mark are then determined and entered, either automatically or manually.

Another embodiment of the above registration mark does not require printing an initial registration mark using the printing mechanism. Instead, a feature on the substrate 105, for example a corner or an indicia on the substrate is used in place of the registration mark. Each of the printing mechanism 120, the epoxy mechanism 130, and the component placement mechanism 140 will have the operation point thereof positioned aligned with the feature. The operation point is optionally, for example and not limitation, a tip of a syringe of the epoxy printing mechanism 130, a tip of a suction nozzle of the component placement device 140, or a print jet orifice or an alignment mark or protrusion of the ink printing mechanism 120. When each of the operations points are aligned with the feature, a position reading of the positioner is taken. If alignment is perfect, all the position readings will be same. However, variations in alignment will result in the readings being different. Several calibration option exist. A first option is to use a relative offset correction that corrects align of the function head module operation points with respect to each other. One of the readings taken when the operation point of a selected function head is aligned with the feature is taken as a base line with the head component offset being the raw position readings from the positioner 90. The reading selected functions as a baseline taken as 0,0,0, i.e., a base origin, and then store differences between the position readings of the other function head components and that of the selected baseline component as head component offsets to be applied in future operations. Operations are then conducted with the selected function head using 0, 0, 0, as a head component offset, and the differences are stored as the head component offsets of the other function head components. Thus, the relative positions of the function head components are compensated for variations in mechanical dimensions.

Another approach is to store the position readings taken when the alignment with the feature is in place as the head component offsets with respect to the zeroed head mount position. These readings are then used as the head component offsets for each head components. In this method, the head component offsets subsume the built-in offsets of the various head components.

Summary.

While particular embodiments of the present disclosure have been shown and described, it will be appreciated by those skilled in the art that, based upon the teachings herein, changes and modifications may be made without departing from this disclosure and its broader aspects and, therefore, the appended claims are to encompass within their scope all such changes and modifications as are within the true spirit and scope of this disclosure. The true spirit and scope is considered to encompass devices and processes, unless specifically limited to distinguish from known subject matter, which provide equivalent functions as required for interaction with other elements of the claims and the scope is not considered limited to devices and functions currently in existence where future developments may supplant usage of currently available devices and processes yet provide the functioning required for interaction with other claim elements. Furthermore, it is to be understood that the disclosure is solely defined by the appended claims. It is understood by those with skill in the art that unless a specific number of an introduced claim element is recited in the claim, such claim element is not limited to a certain number. For example, introduction of a claim element using the indefinite article "a" or "an" does not limit the claim to "one" of the element. Still further, the following appended claims can contain usage of the introductory phrases "at least one" and "one or more" to introduce claim elements. Such phrases are not considered to imply that the introduction of a claim element by the indefinite articles "a" or "an" limits any particular claim containing such introduced claim element to disclosures containing only one such element, even when the same claim includes the introductory phrases "one or more" or "at least one" and indefinite articles such as "a" or "an"; similarly, the use in the claims of definite articles does not alter the above related interpretation indefinite articles such as "a" or "an".

What is claimed is:

1. A computer-implemented method for producing printer control data configured to operate a printer unit to produce a printed circuit board, the printing unit being responsive to the printer control data for printing at least one of or both of a conductive material or nonconductive material at a given time, the method comprising:
   accepting circuit schematic information of a circuit to be embodied in the printed circuit board; and
   generating said printer control data based on said circuit schematic information, said printer control data defining:
      first and second printed intersecting conductive traces wherein the second printed intersecting conductive trace intersects the first printed intersecting conductive trace at an intersection location as viewed from a direction perpendicular to the printed circuit board, the first and second printed intersecting conductive traces being defined by the circuit schematic information as not electrically connected by the printed circuit board absent circuit components to be mounted; and
      a printed insulator configured to be printed interposed between said first and second printed intersecting traces at the intersection location to insulate said first printed intersecting conductive trace from said second printed intersecting conductive trace.

2. The computer-implemented method of claim 1 wherein said circuit schematic information includes component population data and the printer unit is configurable to dispense a conductive bonding material either alone or in combination with any one or more of functions for said printing of conductive material, or said printing of nonconductive material, the method further comprising said generating said printer control data including:
   generating and including bonding material dispensing data and data for printing printed component connection pads in the printer control data for directing printing of said printed component connection pads using said conductive material and dispensing of the conductive bonding material on said printed component connection pads.

3. The computer-implemented method of claim 2 wherein the printer unit is configurable to effect component placement on the printed circuit board configured either alone or in combination with any one or more of functions for said printing of conductive material, said printing of nonconductive material, or said dispensing a conductive bonding material; said method further comprising generating component placement data included in said printer control data and based on the circuit schematic information, said component placement data being configured to operate said printer unit to place components onto the printed circuit board.

4. A method for producing a populated printed circuit board using the computer-implemented method of claim 3, comprising:

installing computer executable code embodying the computer-implemented method into a computing device interfaced with said printer unit;

entering said circuit schematic information into said computing device in accordance with the computer-implemented method and executing the computer-implemented method to produce said printer control data;

loading said printer unit with said conductive material;

loading said printer unit with said nonconductive material;

loading said printer unit with said conductive bonding material;

loading said printer unit with said components; and applying said printer control data to said printer unit effect printing of said conductive material, said nonconductive material, and said conductive bonding material and mounting of said components.

5. The method of claim 4 wherein the computing device is embodied in a web-based service.

6. The method of claim 4 wherein the computing device is distributed amongst the printer unit and a local computer.

7. A digital storage medium containing computer executable code embodying the computer-implemented method of claim 3.

8. The computer-implemented method of claim 3 wherein said generating said printed insulator comprises dimensioning said printed insulator based on an overlap area of said first and second printed intersecting conductive traces.

9. The computer-implemented method of claim 8 wherein said printed insulator is dimensioned to extend beyond said overlap area by an amount determined by an oversize dimension.

10. The computer-implemented method of claim 1 wherein said generating said printed insulator comprises dimensioning said printed insulator based on an overlap area of said first and second printed intersecting conductive traces.

11. The computer-implemented method of claim 10 wherein said printed insulator is dimensioned to extend beyond said overlap area by an amount determined by an oversize dimension.

12. The computer-implemented method of claim 1 further comprising said generating said printer control data including:

generating first and second printed connected conductive traces based on said circuit schematic information, said first and second printed connected conductive traces intersecting, as viewed from a direction perpendicular to the printed circuit board, and are electrically connected at the intersection;

identifying a connection location of said first and second printed connected conductive traces; and incorporating a clearance hole in said printed insulator such that said first and second printed connected conductive traces make electrical contact by printing of said second printed connected conductive trace so as to contact said printed insulator and said first printed connected conductive trace through said clearance hole.

13. The computer-implemented method of claim 12 further comprising said generating said printer control data including:

generating pairs of the first and second printed intersecting conductive traces based on the circuit schematic information; and said generation of said printed insulator including:

identifying intersection locations of said pairs of the first and second printed intersecting conductive traces; and generating said printed insulator as a printed insulator region encompassing the intersection locations such that said first printed intersecting conductive traces do not make an electrical connection with said second printed intersecting conductive traces when printed overlapping one another with said printed insulator region interposed therebetween.

14. The computer-implemented method of claim 13 wherein said generating said printed insulator further comprises:

identifying an overlap area of said pairs of the first and second printed intersecting conductive traces; and dimensioning said printed insulator region using an oversize dimension such that said printed insulator region extends beyond said overlap area of said pairs of the first and second printed intersecting conductive traces by an amount defined by said oversize dimension.

15. The computer-implemented method of claim 14 wherein said circuit schematic information includes component population data and the printer unit is configurable to dispense a conductive bonding material on the substrate either alone or in combination with any one or more of functions for said printing of conductive material, or said printing of nonconductive material, the method further comprising said generating said printer control data including:

generating and including bonding material dispensing data and data for printing printed component connection pads in the printer control data for directing printing of said printed component connection pads using said conductive material and dispensing of the conductive bonding material on said printed component connection pads.

16. The computer-implemented method of claim 15, wherein the printer unit is configurable to effect component placement using a component placement device, the method further comprising producing said printer control data to include component placement data to direct the printer unit to place a component onto the conductive bonding material dispensed on the component connection pads.

17. The computer-implemented method of claim 1 wherein said printer control data is formatted as Gerber data.

18. The computer-implemented method of claim 1 further comprising:

generating pairs of the first and second printed intersecting conductive traces based on the circuit schematic information; and said generation of said printed insulator including:

identifying intersection locations of said pairs of the first and second printed intersecting conductive traces; and generating said printed insulator as a printed insulator region encompassing the intersection locations such that said first printed intersecting conductive traces do not make an electrical connection with said second printed intersecting conductive traces when printed overlapping one another with said printed insulator region interposed therebetween.

19. A computer-implemented method for producing printer control data configured to operate a printer unit to produce a printed circuit board, the printing unit being responsive to said printer control data for printing at least one of or both of a conductive material or nonconductive material at a given time, the method comprising:

accepting circuit schematic information of a circuit to be embodied in the printed circuit board; and generating said printer control data based on said circuit schematic information, said printer control data defining:

first and second printed intersecting conductive traces wherein said second printed intersecting conductive trace intersects said first printed intersecting conductive trace at an overlap area at an intersection location as viewed from a direction perpendicular to the printed circuit board, said first and second printed intersecting conductive traces being defined by the circuit schematic information as not electrically connected by the printed circuit board absent circuit components to be mounted, said second printed intersecting conductive trace being defined to include a break at said overlap area such that said second printed intersecting conductive trace does not make electrical connection with said first printed intersecting trace when said first and second printed intersecting traces are printed coplanar; and a printed insulator configured to be printed at said overlap area over said first printed intersecting conductive trace and generation and inclusion of a printed connecting conductor in said printer control data, said printed connecting conductor being configured to bridge said break and effect electrical connection of said second printed intersecting trace across said break and said printed insulator with said printed insulator insulating said first printed intersecting conductive trace from said printed connecting conductor.

20. A computer-implemented method for producing printer control data configured to operate a printer unit to produce a printed circuit board, the printing unit being responsive to the printer control data for printing at least one of or both of a conductive material or nonconductive material at a given time, the method comprising:

accepting multilayer circuit layout data for laminated layer circuit production, said multilayer circuit layout data defining:

first and second conductor layers respectively including first and second intersecting conductive traces wherein the second intersecting conductive trace intersects the first intersecting conductive trace at an intersection location as viewed from a direction perpendicular to said first and second conductive layers, the first and second intersecting conductive traces not being electrically connected at said intersection location;

converting said multilayer circuit layout data to produce said printer control data for controlling the printer unit to print the conductive material to produce:

a first printed intersecting conductive trace corresponding to said first intersecting conductive trace, and a second printed intersecting conductive trace corresponding to said second intersecting conductive trace; and generating data defining an insulator printing including a printed insulator, said printed insulator being configured based on said multilayer circuit board layout data defining said first and second intersecting conductive traces and defined to be printed interposed between said first and second printed intersecting conductive traces at the intersection location to insulate said first printed intersecting conductive trace from said second printed intersecting conductive trace.

21. The computer-implemented method of claim 20 wherein said multilayer circuit layout data includes component population data and component connection pad data and the printer unit is configurable to dispense a conductive bonding material on the substrate either alone or in combination with any one or more of functions for said printing of conductive material, or said printing of nonconductive material, the computer-implemented method further comprising said generating said printer control data including:

generating and including bonding material dispensing data and data for printing printed component connection pads in the printer control data for directing printing of said printed component connection pads using said conductive material and dispensing of the conductive bonding material on said printed component connection pads.

22. The computer-implemented method of claim 21 wherein the printer unit is configurable to effect component placement on the substrate configured either alone or in combination with any one or more of functions for said printing of conductive material, said printing of nonconductive material, or said dispensing a conductive bonding material, said computer-implemented method further comprising generating component placement data into said printer control data to direct the printer unit to effect component placement based on said component population data.

23. The computer-implemented method of claim 22 wherein said generating said printed insulator comprises dimensioning said printed insulator based on an overlap area of said first and second printed intersecting conductive traces.

24. The computer-implemented method of claim 23 wherein said printed insulator is dimensioned to extend beyond said overlap area by an amount determined by an oversize dimension.

25. The computer-implemented method of claim 20 further comprising:

the multilayer circuit layout data defining first and second connected conductive traces which intersect as viewed from a direction perpendicular to the first and second conductive layers, are connected in accordance with the multilayer circuit layout data, and are respectively of the first and second conductive layers; and converting said multilayer circuit layout data to combine said first connected conductive trace with at least a portion of said second connected conductive trace into a combined printed trace defined to control the printer unit to print said combined printed trace in a single layer of said printed circuit board.

26. The computer-implemented method of claim 20 further comprising:

the multilayer circuit layout data defining first and second connected conductive traces which intersect, as viewed from a direction perpendicular to the first and second conductive layers, are connected by a via hole, and are respectively of the first and second multilayer conductor layers;

said converting said multilayer circuit layout data including:

conversion of said first connected conductive trace to a first printed connected conductive trace; and conversion of said second connected conductive trace to a second printed connected conductive trace;

said generating data defining said insulator printing including:
- identifying a connection location of said first and second printed connected conductive traces; and
- incorporating a clearance hole in said printed insulator such that said first and second printed connected conductive traces make electrical contact by printing of said second printed connected conductive trace so as to contact said printed insulator and said first printed connected conductive trace through said clearance hole.

27. The computer-implemented method of claim 26 further comprising:
    the multilayer circuit layout data defining pairs of the first and second intersecting conductive traces respectively of the first and second conductive layers, the pairs of the first and second intersecting conductive traces being defined as not electrically connected by the multilayer circuit layout data;
    conversion of said multilayer circuit layout data to produce said printer control data defining pairs of first and second printed intersecting conductive traces corresponding to said pairs of the first and second intersecting conductive traces; and
    said generation of data defining said printed insulator including:
    - identifying intersection locations of said pairs of first and second printed intersecting conductive traces; and
    - generating said printed insulator as a printed insulator region encompassing the intersection locations such that said first printed intersecting conductive traces do not make an electrical connection with said second printed intersecting conductive traces when printed overlapping one another with said printed insulator region interposed therebetween.

28. The computer-implemented method of claim 27 wherein said generating said printed insulator comprises dimensioning said printed insulator based on an overlap area of said pairs of said first and second printed intersecting conductive traces.

29. The computer-implemented method of claim 28 wherein said printed insulator is dimensioned to extend beyond said overlap area of said pairs of first and second printed intersecting conductive traces by an amount determined by an oversize dimension.

30. A method for producing a populated printed circuit board on a substrate using the computer-implemented method of claim 20, comprising:
    installing computer executable code embodying the computer-implemented method into a computing device interfaced with said printer unit;
    entering said multilayer circuit layout data for laminated layer circuit production into said computing device in accordance with the computer-implemented method and executing the computer-implemented method to produce said printer control data;
    loading said printer unit with said conductive material;
    loading said printer unit with said nonconductive material;
    loading said printer unit with said conductive bonding material;
    loading said printer unit with said components; and
    applying said printer control data to said printer unit effect printing of said conductive material, said nonconductive material, and said conductive bonding material and mounting of said components.

31. The method of claim 30 wherein the computing device is embodied in a web-based service.

32. The method of claim 30 wherein the computing device is distributed amongst the printer unit and a local computer.

33. A digital storage medium containing computer executable code embodying the computer-implemented method of claim 20.

34. The computer-implemented method of claim 20 further comprising:
    the multilayer circuit layout data defining pairs of the first and second intersecting conductive traces respectively of the first and second conductive layers, the pairs of the first and second intersecting conductive traces being defined as not electrically connected by the multilayer circuit layout data;
    conversion of said multilayer circuit layout data to produce said printer control data defining pairs of first and second printed intersecting conductive traces corresponding to said pairs of the first and second intersecting conductive traces; and
    said generation of data defining said printed insulator including:
    - identifying intersection locations of said pairs of first and second printed intersecting conductive traces; and
    - generating said printed insulator as a printed insulator region encompassing the intersection locations such that said first printed intersecting conductive traces do not make an electrical connection with said second printed intersecting conductive traces when printed overlapping one another with said printed insulator region interposed therebetween.

35. A computer-implemented method for producing printer control data configured to operate a printer unit to produce a printed circuit board, the printing unit being responsive to the printer control data for printing at least one of or both of a conductive material or nonconductive material at a given time, the method comprising:
    accepting multilayer circuit layout data for laminated layer circuit production, said multilayer circuit layout data defining:
    first and second conductor layers respectively including first and second intersecting conductive traces wherein the second intersecting conductive trace intersects the first intersecting conductive trace at an intersection location as viewed from a direction perpendicular to said first and second conductive layers, the first and second intersecting conductive traces not being electrically connected at said intersection location;
    converting said multilayer circuit layout data to produce the printer control data for controlling the printer unit to print the conductive material to produce:
    a first printed intersecting conductive trace corresponding to said first intersecting conductive trace, and a second printed intersecting conductive trace corresponding to said second intersecting conductive trace; and
    defining said second printed intersecting conductive trace to include a break at an overlap area of said first printed intersecting conductive trace such that said second printed intersecting conductive trace does not make electrical connection with said first printed intersecting trace when said first and second printed intersecting traces are printed coplanar; and generation of a printed connecting conductor in said printer control data for printing said conductive material, said printed connecting conductor being configured to bridge said break and effect electrical connection of said second printed intersecting trace across said break; and generating said printer control data to define a printed insulator, said printed insulator being configured to be printed interposed between said first printed intersecting conductive trace at the intersection location and said printed connecting conductor to insulate said first printed intersecting conductive trace from said printed connecting conductor.

36. The computer-implemented method of claim 35 wherein said generating said printed insulator comprises dimensioning said printed insulator based on an overlap area of said first and second printed intersecting conductive traces.

37. The computer-implemented method of claim 36 wherein said printed insulator is dimensioned to extend beyond said overlap area by an amount determined by an oversize dimension.

38. The computer-implemented method of claim 35 wherein said multilayer circuit layout data includes component population data and component connection pad data and the printer unit is configurable to dispense a conductive bonding material either alone or in combination with any one or more of functions for said printing of conductive material, or said printing of nonconductive material, the computer-implemented method further comprising:

generating and including bonding material dispensing data and data for printing printed component connection pads in the printer control data for directing printing of said printed component connection pads using said conductive material and dispensing of the conductive bonding material on said printed component connection pads.

39. The computer-implemented method of claim 38 wherein the printer unit is configurable to effect component placement on the substrate configured either alone or in combination with any one or more of functions for said printing of conductive material, said printing of nonconductive material, or said dispensing a conductive bonding material, said computer-implemented method further comprising generating component placement data into said printer control data to direct the printer unit to effect component placement based on said component population data.

* * * * *